(12) United States Patent
Chung et al.

(10) Patent No.: US 10,847,663 B2
(45) Date of Patent: Nov. 24, 2020

(54) SOLAR CELL AND METHOD FOR MANUFACTURING THE SAME

(71) Applicant: LG ELECTRONICS INC., Seoul (KR)

(72) Inventors: Indo Chung, Seoul (KR); Seunghwan Shim, Seoul (KR); Ilhyoung Jung, Seoul (KR); Jeongbeom Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 41 days.

(21) Appl. No.: 14/607,904

(22) Filed: Jan. 28, 2015

(65) Prior Publication Data

US 2015/0214397 A1 Jul. 30, 2015

(30) Foreign Application Priority Data

Jan. 29, 2014 (KR) ........................ 10-2014-0011648

(51) Int. Cl.
*H01L 31/0224* (2006.01)
*H01L 31/0216* (2014.01)
*H01L 31/18* (2006.01)
*H01L 31/0747* (2012.01)
*H01L 21/268* (2006.01)

(52) U.S. Cl.
CPC .... *H01L 31/022458* (2013.01); *H01L 21/268* (2013.01); *H01L 31/02168* (2013.01); *H01L 31/022441* (2013.01); *H01L 31/0747* (2013.01); *H01L 31/18* (2013.01); *Y02E 10/50* (2013.01)

(58) Field of Classification Search
CPC ......... H01L 31/022458; H01L 31/0682; H01L 31/022441–022458; H01L 31/022425–022458; H01L 31/182–1824; H01L 31/068–0684; H01L 31/1804–1824
See application file for complete search history.

(56) References Cited

U.S. PATENT DOCUMENTS

| 5,449,626 A | 9/1995 | Hezel |
| 7,339,110 B1* | 3/2008 | Mulligan ........ H01L 31/022441 136/256 |
| 2007/0148336 A1* | 6/2007 | Bachrach ................ C23C 14/35 427/97.1 |
| 2007/0256728 A1 | 11/2007 | Cousins |

(Continued)

FOREIGN PATENT DOCUMENTS

| CN | 101438420 A | 5/2009 |
| CN | 102405528 A | 4/2012 |

(Continued)

OTHER PUBLICATIONS

Machine translation of WO 2010122028 A2.*

(Continued)

*Primary Examiner* — William E McClain
(74) *Attorney, Agent, or Firm* — Birch, Stewart, Kolasch & Birch, LLP

(57) ABSTRACT

A solar cell includes a semiconductor substrate; at least one conductive type region on the semiconductor substrate; a protective layer on the at least one conductive type region; and an electrode disposed on the protective layer and electrically connected to the conductive type region.

12 Claims, 10 Drawing Sheets

(56) References Cited

U.S. PATENT DOCUMENTS

| | | | |
|---|---|---|---|
| 2009/0250352 A1* | 10/2009 | Dubin | C25D 3/38 205/143 |
| 2010/0186808 A1 | 7/2010 | Borden | |
| 2010/0297835 A1* | 11/2010 | Chuang | H01L 21/02422 438/488 |
| 2011/0126898 A1 | 6/2011 | Harley et al. | |
| 2012/0171804 A1* | 7/2012 | Moslehi | B23K 26/073 438/71 |
| 2012/0204926 A1* | 8/2012 | Harley | H01L 31/022441 136/244 |
| 2012/0222735 A1* | 9/2012 | Xu | H01L 31/068 136/256 |
| 2012/0225515 A1* | 9/2012 | Moslehi | B23K 26/0608 438/69 |
| 2012/0322199 A1* | 12/2012 | Graff | H01L 31/0682 438/97 |
| 2013/0112253 A1 | 5/2013 | Oh et al. | |
| 2013/0125968 A1* | 5/2013 | Sinha | H01L 31/02243 136/256 |
| 2014/0000686 A1* | 1/2014 | Mungekar | H01L 31/02167 136/252 |
| 2014/0096823 A1* | 4/2014 | Fu | H01L 31/022433 136/256 |
| 2015/0090329 A1* | 4/2015 | Pass | H01L 31/022441 136/256 |

FOREIGN PATENT DOCUMENTS

| | | |
|---|---|---|
| CN | 102640300 A | 8/2012 |
| DE | 10 2009 018 112 B3 | 12/2010 |
| JP | 62-49655 A | 3/1987 |
| JP | 3-102834 A | 4/1991 |
| JP | 3-250671 A | 11/1991 |
| JP | 6-61515 A | 3/1994 |
| JP | 2003-124483 A | 4/2003 |
| JP | 2009-71221 A | 4/2009 |
| JP | 2012-69538 A | 4/2012 |
| JP | 2013-512582 A | 4/2013 |
| KR | 10-2013-0050721 A | 5/2013 |
| KR | 10-2013-0068410 A | 6/2013 |
| KR | 10-2013-0068962 A | 6/2013 |
| WO | WO 2010122028 A2 * | 10/2010 ....... H01L 31/02167 |

OTHER PUBLICATIONS

"Thermal Expansion." Wikipedia, Wikimedia Foundation, Feb. 21, 2018, en.wikipedia.org/wiki/Thermal_expansion#Thermal_expansion_coefficients_for_various_materials.*

Kluska, et al. "Modeling and optimization study of industrial n-type high-efficiency back-contact back-junction silicon solar cells." Solar Energy Materials and Solar Cells 94.3 (2010): 568-577. (Year: 2010).*

Grohe et al., "Selective Laser Ablation of Anti-Reflection Coatings for Novel Metallization Techniques", Conference Record of the 2006 IEEE 4th World Conference on Photovoltaic Energy Conversion, IEEE, May 2006, pp. 1399-1402.

Knorz et al., "Selective Laser Ablation of $SiN_x$ Layers on Textured Surfaces for Low Temperature Front Side Metallizations", Prog. Photovolt: Res. Appl., vol. 17, Oct. 15, 2008, pp. 127-136.

* cited by examiner (a)

(b)

(c)

SOLAR CELL AND METHOD FOR MANUFACTURING THE SAME

CROSS-REFERENCE TO RELATED APPLICATION

This application claims priority to and the benefit of Korean Patent Application No. 10-2014-0011648, filed on Jan. 29, 2014 in the Korean Intellectual Property Office, the disclosure of which is incorporated herein by reference.

BACKGROUND OF THE INVENTION

1. Field of the Invention

The present invention relates to a solar cell and a method for manufacturing the same and, more particularly, to a solar cell having an improved structure of an electrode connection and a method for manufacturing the same.

2. Description of the Related Art

In recent years, as conventional energy resources such as petroleum and coal are running out, interest in alternative energy resources replacing these energy resources is on the rise. Of these, solar cells are attracting considerable attention as next generation cells which convert solar energy into electrical energy.

Such a solar cell is manufactured by forming various layers and electrodes according to design. Efficiency of solar cells may be determined according to the design of various layers and electrodes. Low efficiency should be overcome so that solar cells can be put to practical use. Accordingly, various layers and electrodes should be designed such that solar cell efficiency is maximized.

SUMMARY OF THE INVENTION

Embodiments of the invention provide solar cells having enhanced efficiency and methods for manufacturing them.

A solar cell according to an embodiment of the invention includes a semiconductor substrate; at least one conductive type region on the semiconductor substrate; a protective layer on the conductive type region; and an electrode disposed on the protective layer and electrically connected to the conductive type region.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
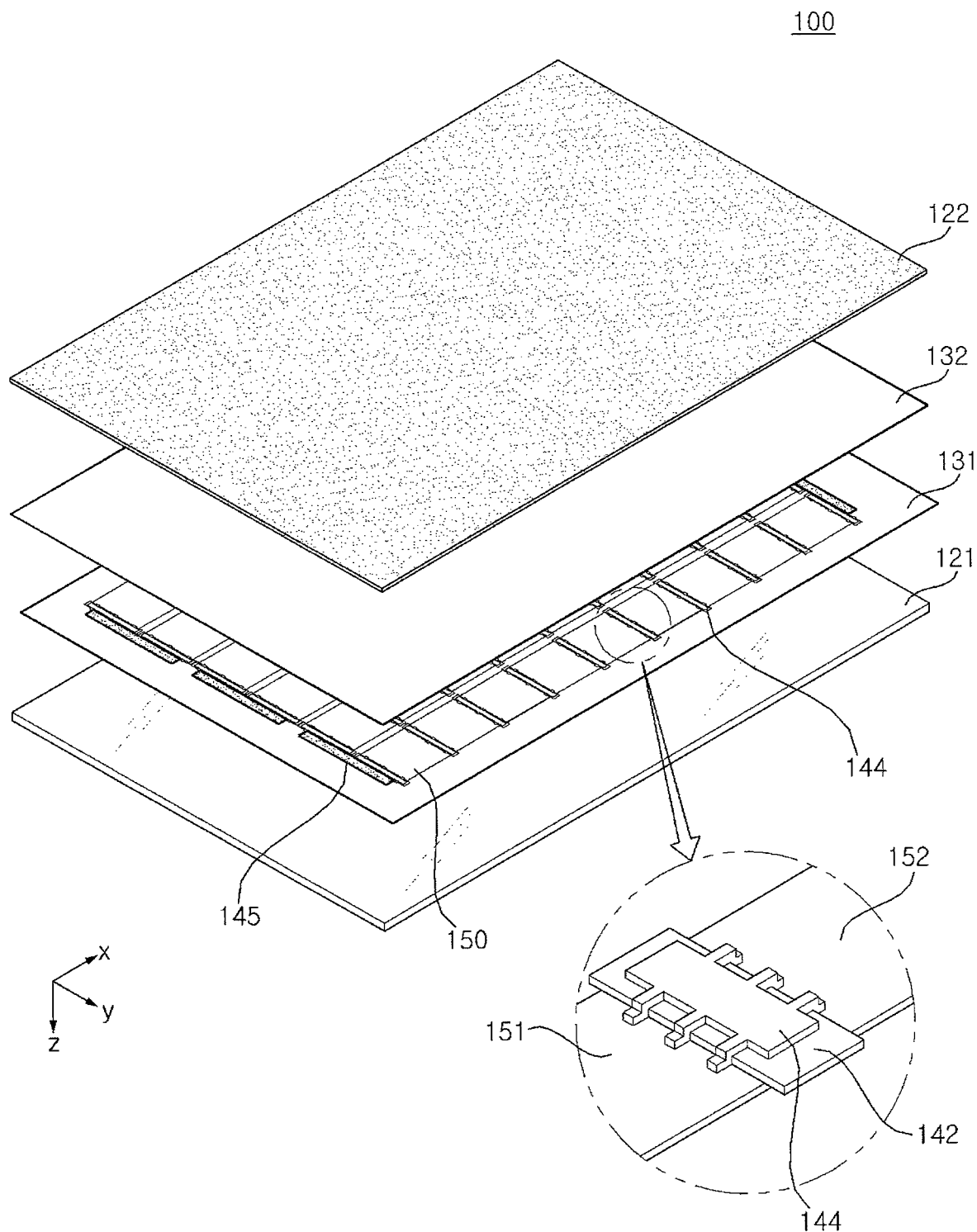
FIG. 1 is a rear perspective view of a solar cell module according to an embodiment of the invention.

Reference will now be made in detail to embodiments of the invention, examples of which are illustrated in the accompanying drawings. However, the invention may be embodied in many different forms and should not be construed as limited to the embodiments set forth herein.

Only elements constituting features of the invention are illustrated in the accompanying drawings and other elements that will not be described herein are omitted from the drawings, for clarity of description. Like reference numerals refer to like elements throughout. In the drawings, the thicknesses, areas, etc., of constituent elements may be exaggerated or reduced for clarity and convenience of illustration. The invention is not limited to the illustrated thicknesses, areas, etc.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a layer, a region or a plate is referred to as being "on" another element, the one element may be directly on the another element, and one or more intervening elements may also be present. In contrast, when one element such as a layer, a layer, a region or a plate is referred to as being "directly on" another element, one or more intervening elements are not present.

Hereinafter, solar cells and a method for manufacturing a solar cell according to embodiments of the invention will be described in detail with reference to the accompanying drawings. First, a solar cell module will be described in detail and thereafter solar cells included therein and electrodes used in the solar cells will be described in detail.

FIG. 1 is a rear perspective view of a solar cell module 100 according to an embodiment of the invention.

Referring to FIG. 1, the solar cell module 100 according to an embodiment of the invention includes at least one solar cell (for example, solar cells) 150, a first substrate 121 (hereinafter referred to as "front substrate") disposed on front surfaces of the solar cells 150, and a second substrate 122 (hereinafter referred to as "back sheet") disposed on back surfaces of the solar cells 150. In addition, the solar cell module 100 may include a first sealant 131 disposed between the solar cells 150 and the front substrate 121 and a second sealant 132 disposed between the solar cells 150 and the back sheet 122. This will be described below in more detail.

First, each solar cell 150 is configured to include a photoelectric conversion unit to convert solar energy into electric energy and an electrode electrically connected to the photoelectric conversion unit. In the embodiment of the invention, the photoelectric conversion unit may, for example, be a photoelectric conversion unit including a semiconductor substrate (e.g., a silicon wafer) or a semiconductor layer (e.g., a silicon layer). The solar cell 150 having the structure described above will be described below in detail with reference to FIGS. 2 and 3.

The solar cell 150 includes a ribbon or ribbons 144. The solar cells 150 may be electrically connected to each other by the ribbons 144 in series, in parallel, or in series-parallel. Adjacent first and second solar cells 151 and 152 will be described by way of example. That is, the ribbon 144 may connect a first electrode 42 (see FIGS. 2 and 3) of the first solar cell 151 to a second electrode 44 (see FIGS. 2 and 3) of the second solar cell 152 adjacent to the first solar cell 151. A connection structure among the ribbon 144, the first electrode 42 of the first solar cell 151, and the second electrode 44 of the second solar cell 152 may be variously changed. For example, the first electrodes 42 of the first and second solar cells 151 and 152 may be connected to each other along a first edge, and the second electrodes 44 of the first and second solar cells 151 and 152 may be connected to each other along a second edge opposite the first edge. In this regard, the ribbon 144 may be formed across the first and second solar cells 151 and 152 so as to connect the first electrode 42 disposed at the first edge of the first solar cell 151 and the second electrode 44 disposed at the second edge of the second solar cell 152 adjacent to the first solar cell 151 and may extend along the first and second edges. In this regard, to prevent unnecessary short circuit between the ribbon 144 and the first and second solar cells 151 and 152, an insulating layer 142 is partially disposed between the ribbon 144 and the first and second solar cells 151 and 152, and a protrusion of the ribbon 144 protruding beyond the insulating layer 142 may be connected to the first or second electrode 42 or 44. However, the embodiments of the invention are not limited to the above examples and various modifications are possible.

In addition, a bus ribbon 145 alternately connects opposite ends of the ribbons 144 of the solar cells 150 connected by the ribbons 144 and arranged in a single row. The bus ribbon 145 may be arranged in a direction crossing end portions of the solar cells 150 arranged in a single row. The bus ribbon 145 may be connected to a junction box that collects electricity generated by the solar cells 150 and prevents reverse flow of electricity.

The first sealant 131 may be disposed on the front surface of the solar cells 150, and the second sealant 132 may be disposed on the back surface of the solar cells 150. The first sealant 131 and the second sealant 132 are adhered to each other by lamination and thus prevent permeation of moisture or oxygen that may adversely affect the solar cells 150 and enable chemical bonding of the elements of the solar cells 150.

The first sealant 131 and the second sealant 132 may be ethylene vinyl acetate (EVA) copolymer resin, polyvinyl butyral, a silicon resin, an ester-based resin, an olefin-based resin, or the like, but the embodiment of the invention is not limited thereto. Thus, the first and second sealants 131 and 132 may be formed using various other materials by various methods other than lamination.

The front substrate 121 is disposed on the first sealant 131 so as to pass sunlight therethrough and may be made of tempered glass to protect the solar cells 150 from external impact and the like. In addition, the front substrate 121 may be made of low-iron tempered glass to prevent reflection of sunlight and increase transmittance of sunlight, but the embodiment of the invention is not limited thereto. That is, the front substrate 121 may be made of various other materials.

The back sheet 122 is disposed on the other surfaces of the solar cells 150 to protect the solar cells 150 and is waterproof and insulating and blocks ultraviolet light. The back sheet 122 may be made of a layer, a sheet, or the like. The back sheet 122 may be of a Tedlar/PET/Tedlar (TPT) type or may be a structure in which polyvinylidene fluoride (PVDF) resin or the like is formed on at least one surface of polyethylene terephthalate (PET). PVDF, which is a polymer having a structure of $(CH_2CF_2)_n$, has a double fluorine molecular structure and thus has excellent mechanical properties, weather resistance and UV resistance, but the embodiment of the invention is not limited thereto. That is, the back sheet 122 may be made of various other materials. In this regard, the back sheet 122 may be made of a material with excellent reflectance so as to reflect sunlight incident from the front substrate 121 and for the sunlight to be reused, but the embodiment of the invention is not limited thereto. That is, the back sheet 122 may be made of a transparent material (e.g., glass) so that sunlight is incident therethrough and thus the solar cell module 100 may be embodied as a double-sided light receiving solar cell module.

The structure of the above-described solar cell 150 will now be described in detail with reference to FIGS. 2 and 3.

Figure 2:
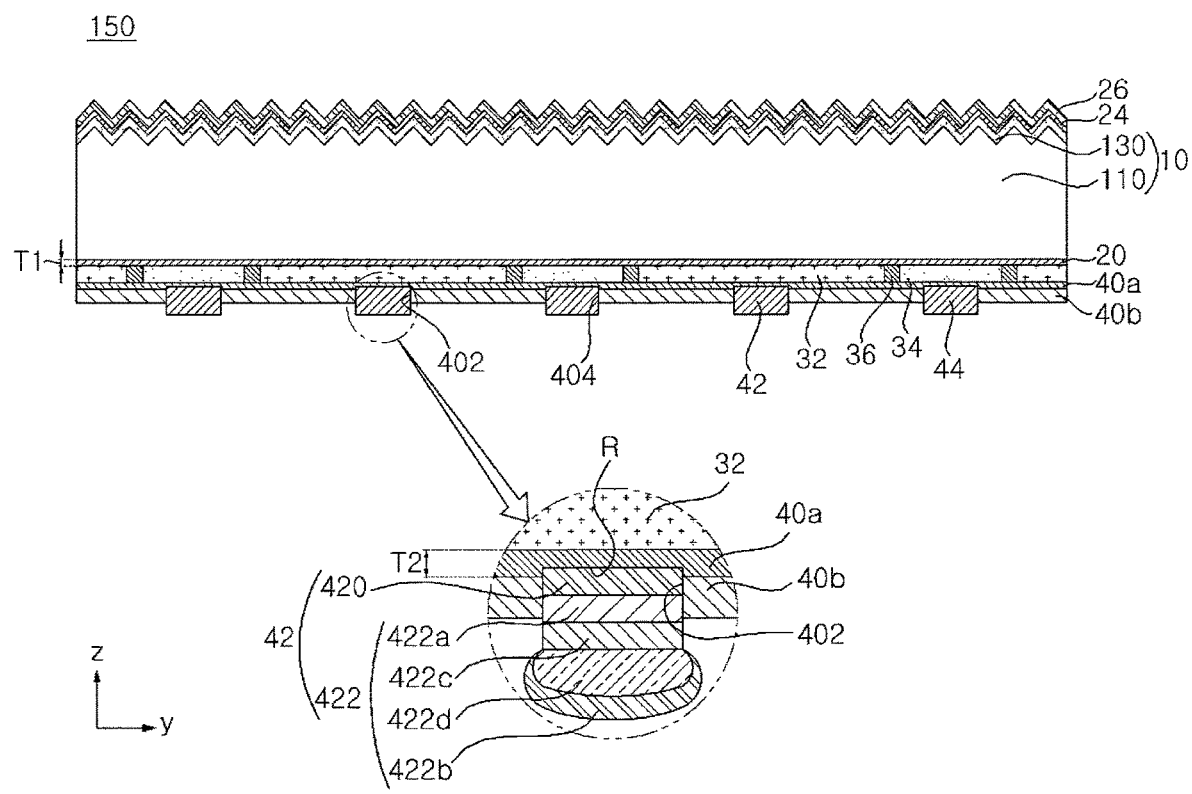
FIG. 2 is a sectional view of a solar cell according to the embodiment of the invention.
Figure 3:
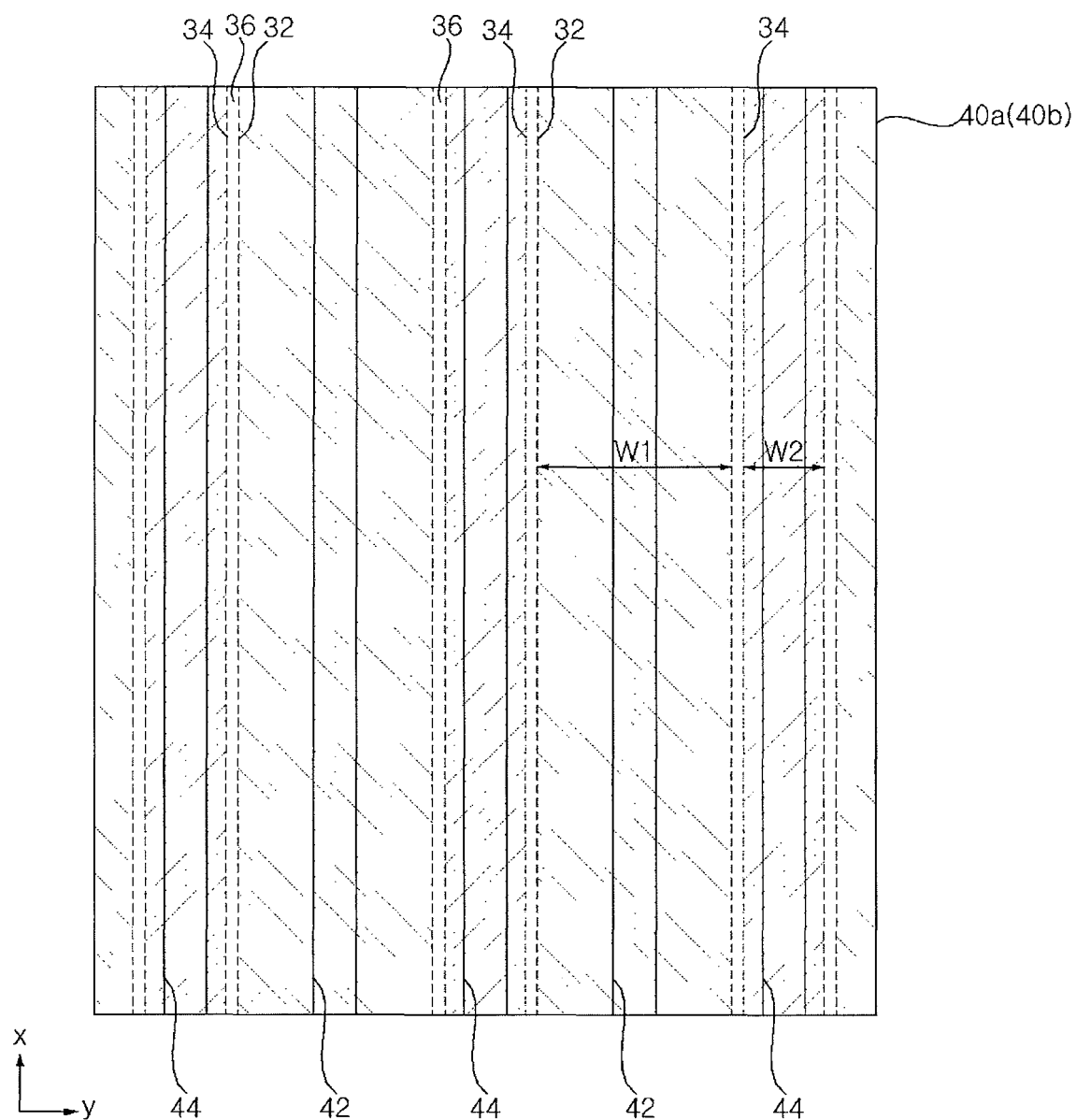
FIG. 3 is a partial rear plan view of the solar cell illustrated in FIG. 2.

FIG. 2 is a sectional view of the solar cell 150 according to the embodiment of the invention, and FIG. 3 is a partial rear plan view of the solar cell 150 of FIG. 2.

Referring to FIGS. 2 and 3, the solar cell 150 according to the embodiment includes a semiconductor substrate 10 including a base region 110, a conductive type region 32 or 34 (or conductive type regions 32 and 34) on the semiconductor substrate 10, a protective layer 40a on the conductive type regions 32 and 34, an electrode 42 or 44 (or electrodes 42 and 44) connected to one of the conductive type regions 32 and 34 while interposing the protective layer 40a. In this instance, the conductive type regions 32 and 34 may include a first conductive type region 32 having a first conductive type and a second conductive type region 34 having a second conductive type. The electrodes 42 and 44 may include a first electrode 42 electrically connected to the first conductive type region 32 and a second electrode 44 electrically connected to the second conductive type region 30. The solar cell 150 may further include a tunneling layer 20, a passivation layer 24, an anti-reflective layer 26, an insulating layer 40b and the like. This will be described in more detail.

The semiconductor substrate 10 may include the base region 110 including the second conductive type dopant (of dopants) at a relatively low doping concentration. The base region 110 may include crystalline semiconductor including the second conductive type dopant. For example, the base region 110 may include single-crystalline or polycrystalline semiconductor including the second conductive type dopant. Particularly, the base region 110 may be a single-crystalline semiconductor (e.g., a single-crystalline wafer, more particularly, a single-crystalline silicon wafer) including the second conductive type dopant. When the base region 110 includes the single-crystalline silicon, the solar cell 150 is a single-crystalline silicon solar cell. The solar cell 150 is based on the base region 110 or the semiconductor substrate 10 including the single-crystalline silicon with a high degree of crystallinity and a low degree of defects, and thus, the solar cell 150 has an enhanced electrical property.

The second conductive type dopant may be of an n-type or a p-type. For example, when the base region 110 is of an n-type, the first conductive type region 32 of a p-type to form a junction (e.g., a pn junction with the tunneling layer 20 disposed therebetween) that forms carriers by photoelectric conversion with the base region 110 has a wide area and thus a photoelectric conversion area may be increased. In addition, in this instance, the first conductive type region 32 having a wide area effectively collects holes having a relatively slow movement rate and thus may further contribute to improvement in photoelectric conversion efficiency. However, the embodiment of the invention is not limited to the above examples.

In addition, the semiconductor substrate 10 may include a front surface field region 130 at a front surface thereof. The front surface field region 130 may have the same conductive type as that of the base region 110 and a higher doping concentration than the base region 110.

In the embodiment of the invention, the front surface field region 130 is a doping region formed by doping the semiconductor substrate 10 with a second conductive type dopant at a relatively high doping concentration. Accordingly, the front surface field region 130 constitutes the semiconductor substrate 10, including a crystalline (single-crystalline or polycrystalline) semiconductor of the second conductive type. For example, the front surface field region 130 may be formed as a portion of a single-crystalline semiconductor substrate (e.g., a single-crystalline silicon wafer substrate) of a second conductive type. However, the embodiment of the invention is not limited to the above examples. Thus, the front surface field region 130 may be formed by doping a separate semiconductor layer from the semiconductor substrate 10 (e.g., an amorphous semiconductor layer, a micro-crystalline semiconductor layer, or a polycrystalline semiconductor layer) with a second conductive type dopant. In another embodiment of the invention, the front surface field region 130 may be a field region that acts similarly to a region formed through doping by fixed charges of a layer (e.g., the passivation layer 24 and/or the anti-reflective layer 26) formed adjacent to the semiconductor substrate 10. For example, when the base region 110 is the n-type, the passivation layer 24 may include an oxide having fixed negative charge (for example, an aluminum oxide) to form an inversion layer at the surface of the base region 110. The inversion layer may be used as the field region. In this instance, the semiconductor substrate 10 does not include an additional doping region and consists of the base region 110, and thus, the defect of the semiconductor substrate 10 can be minimized. The front surface field region 130 having various structures may be formed using various other methods.

In the embodiment of the invention, the front surface of the semiconductor substrate 10 may be textured to have an uneven surface (or protruded portions and/or depressed portions) in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like, and have a lower surface roughness than the front surface of the semiconductor substrate 10. As in the embodiment of the invention, when the first and second conductive type regions 32 and 34 are formed together on the back surface of the semiconductor substrate 10, characteristics of the solar cell 150 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cell 150 may be enhanced. However, the embodiment of the invention is not limited to the above example. In some instances, an uneven portion may be formed at the back surface of the semiconductor substrate 10 by texturing. In addition, various modifications are possible.

The tunneling layer 20 is formed on the back surface of the semiconductor substrate 10 between the semiconductor substrate 10 and conductive type regions 32 and 34. Interface properties of the back surface of the semiconductor substrate 10 may be enhanced by the tunneling layer 20 and the tunneling layer 20 enables carriers generated by photoelectric conversion to be smoothly transferred by tunneling effects. The tunneling layer 20 may include various materials enabling carriers to tunnel therethrough, e.g., an oxide, a nitride, a semiconductor, a conductive polymer, or the like. For example, the tunneling layer 20 may include a silicon oxide, a silicon nitride, a silicon oxynitride, an intrinsic amorphous silicon, an intrinsic polycrystalline silicon, or the like. In this regard, the tunneling layer 20 may be formed over the entire back surface of the semiconductor substrate 10. Accordingly, the tunneling layer 20 may completely passivate the back surface of the semiconductor substrate 10 and be easily formed without separate patterning.

To have sufficient tunneling effects, the tunneling layer 20 may have a thickness T1 that is smaller than that of the insulating layer 40b. For example, the thickness T1 of the tunneling layer 20 may be 10 nm or less, for example, 0.5 nm to 10 nm (more particularly, 0.5 nm to 5 nm, e.g., 1 nm to 4 nm). When the thickness T1 of the tunneling layer 20 exceeds 10 nm, tunneling does not smoothly occur and thus the solar cell 150 may not operate. On the other hand, when the thickness T1 of the tunneling layer 20 is less than 0.5 nm, it may be difficult to form the tunneling layer 20 with desired quality. To further improve the tunneling effects, the thickness T1 of the tunneling layer 20 may be 1.2 nm to 1.8 nm. However, the embodiment of the invention is not limited to the above examples and the thickness T1 of the tunneling layer 20 may have various values.

The conductive type regions 32 and 34 may be disposed on the tunneling layer 20. More particularly, the conductive type regions 32 and 34 may include the first conductive type region 32 including the first conductive type dopant thus having the first conductive type and the second conductive type region 34 including the second conductive type dopant thus having the second conductive type. In addition, a barrier region 36 may be disposed between the first and second conductive type regions 32 and 34.

The first conductive type region 32 forms a pn junction (or pn tunnel junction) with the base region 110 while disposing the tunneling layer 20 therebetween and thus constitutes an emitter region that generates carriers by photoelectric conversion.

In this regard, the first conductive type region 32 may include a semiconductor (e.g., silicon) including the first conductive type dopant opposite the base region 110. In the embodiment of the invention, the first conductive type region 32 is formed separately from the semiconductor substrate 10, on the semiconductor substrate 10 (more particularly, on the tunneling layer 20). The first conductive type region 32 may be formed as a semiconductor layer doped with the first conductive type dopant. Thus, the first conductive type region 32 may be formed as a semiconductor layer having a different crystal structure than the semiconductor substrate 10 so as to be easily formed on the semiconductor substrate 10. For example, the first conductive type region 32 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a first conductive type dopant. The first conductive type dopant may be included in the semiconductor layer when forming the semiconductor layer or may be included in the semiconductor layer by various doping methods such as thermal diffusion, ion implantation, and the like after forming the semiconductor layer.

In this regard, the first conductive type dopant may be any dopant having a conductive type opposite the base region 110. That is, when the first conductive type dopant is of a p-type, the first conductive type dopant may be a Group III element such as B, Al, Ga, In, or the like. When the first conductive type dopant is of an n-type, the first conductive type dopant may be a Group V element such as P, As, Bi, Sb, or the like.

The second conductive type region 34 forms a back surface field and thus forms a back surface field region that prevents loss of carriers by recombination at a surface (more particularly, the back surface) of the semiconductor substrate 10.

In this regard, the second conductive type region 34 may include a semiconductor (e.g., silicon) including the same second conductive type dopant as that of the base region 110. In the embodiment of the invention, the second conductive type region 34 is formed separately from the semiconductor substrate 10, on the semiconductor substrate 10 (more particularly, on the tunneling layer 20). The second conductive type region 34 is formed as a semiconductor layer doped with a second conductive type dopant. Thus, the second conductive type region 34 may be formed as a semiconductor layer having a different crystal structure than the semiconductor substrate 10 so as to be easily formed on the semiconductor substrate 10. For example, the second conductive type region 34 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a second conductive type dopant. The second conductive type dopant may be included in the semiconductor layer when forming the semiconductor layer or may be included in the semiconductor layer by various doping methods such as thermal diffusion, ion implantation, and the like after forming the semiconductor layer.

In this regard, the second conductive type dopant may be any dopant having the same conductive type as that of the base region 110. That is, when the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like.

In addition, the barrier region 36 is disposed between the first and second conductive type regions 32 and 34 to separate the first conductive type region 32 from the second conductive type region 34. When the first and second conductive type regions 32 and contact each other, shunting may occur and, accordingly, performance of the solar cell 150 may be deteriorated. Thus, in the embodiment of the invention, the barrier region 36 may be disposed between the first and second conductive type regions 32 and 34 to prevent unnecessary occurrence of shunting.

The barrier region 36 may include various materials enabling the first and second conductive type regions 32 and 34 to be substantially insulated from each other. That is, the barrier region 36 may be formed of an undoped insulating material (e.g., an oxide or a nitride). In another embodiment of the invention, the barrier region 36 may include an intrinsic semiconductor. In this regard, the first and second conductive type regions 32 and 34 and the barrier region 36 are formed on the same plane, have substantially the same thickness, are formed of the same semiconductor (e.g., amorphous silicon, micro-crystalline silicon, or polycrystalline silicon), and may not include a dopant. For example, a semiconductor layer including a semiconductor material may be formed, a region of the semiconductor layer is doped with a first conductive type dopant to form the first conductive type region 32, another region thereof is doped with a second conductive type dopant to form the second conductive type region 34, and the barrier region 36 may be formed in a region of the semiconductor layer in which the first and second conductive type regions 32 and 34 are not formed. According to the embodiment of the invention, a manufacturing method of the first and second conductive type regions 32 and 34 and the barrier region 36 may be simplified.

However, the embodiment of the invention is not limited to the above examples. That is, when the barrier region 36 is formed separately from the first and second conductive type regions 32 and 34, the barrier region 36 may have a different thickness than that of the first and second conductive type regions 32 and 34. For example, to more effectively prevent short circuit between the first and second conductive type regions 32 and 34, the thickness of the barrier region 36 may be greater than that of the first and second conductive type regions 32 and 34. In another embodiment of the invention, to reduce raw material costs for forming the barrier region 36, the thickness of the barrier region 36 may be less than that of the first and second conductive type regions 32 and 34. In addition, various modifications are possible. In addition, a base material of the barrier region 36 may be different than those of the first and second conductive type regions 32 and 34. In another embodiment of the invention, the barrier region 36 may be formed as an empty space (e.g., a trench) disposed between the first and second conductive type regions 32 and 34.

In addition, the barrier region 36 may be formed so as to partially separate the first and second conductive type regions 32 and 34 at an interface therebetween from each other. Thus, some portion of the interface between the first and second conductive type regions 32 and 34 may be separated from each other, while the other portion of the interface between the first and second conductive type regions 32 and 34 may contact each other. In addition, the barrier region 36 may not be necessarily formed, and the first and second conductive type regions 32 and 34 may entirely contact each other. In addition, various modifications are possible.

In this regard, the second conductive type region 34 having the same conductive type as that of the base region 110 may have a narrower area than that of the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are n-type conductive and the first conductive type region 32 is p-type conductive, the first conductive type region 32 having a wide area may effectively collect holes having a relatively slow movement rate. The planar structure of the first and second conductive type regions 32 and 34 and the barrier region 36 will be described below in further detail with reference to FIG. 3.

In the embodiment of the invention, an instance in which the first and second conductive type regions 32 and 34 are disposed on the back surface of the semiconductor substrate 10 with the tunneling layer 20 disposed therebetween has been described by way of example. However, the embodiment of the invention is not limited to the above example. In another embodiment of the invention, the tunneling layer 20 need not be formed and the first and second conductive type regions 32 and 34 may be formed as doping regions formed by doping the semiconductor substrate 10 with a dopant. That is, the first and second conductive type regions 32 and 34 may be formed as doping regions having a single-crystalline semiconductor structure constituting a portion of the semiconductor substrate 10. The first and second conductive type regions 32 and 34 may be formed using various other methods.

Further, in the embodiment of the invention, the first and second conductive type regions 32 and 34 are formed together on the same surface (for example, the back surface) of the semiconductor substrate 10, and one protective layer 40a and one insulating layer 40b are formed on the first and second conductive type regions 32 and 34. However, the embodiment of the invention is not limited thereto. Therefore, one of the first and second conductive type regions 32 and 34 may be disposed on one surface (the front surface or the back surface) of the semiconductor substrate 10, and the other of the first and second conductive type regions 32 and 34 may be disposed on the other surface (the back surface or the front surface) of the semiconductor substrate 10. In this instance, one protective layer 40a and one insulating layer 40b may be disposed on the first conductive type region 32, and/or another protective layer 40a and another insulating layer 40b may be disposed on the second conductive type region 34. Thus, in the specification, the descriptions for the conductive type regions 32 and 34, the electrodes 42 and 44, the protective layer 40a, and the insulating layer 40b may be applied to the first conductive type region 32, the first electrode 42, and the protective layer 40a and the insulating layer 40b disposed on the first conductive type region 32. Also, the descriptions for the conductive type regions 32 and 34, the electrodes 42 and 44, the protective layer 40a, and the insulating layer 40b may be applied to the second conductive type region 34, the second electrode 44, and the protective layer 40a and the insulating layer 40b disposed on the second conductive type region 34. In addition, the descriptions for the conductive type regions 32 and 34, the electrodes 42 and 44, the protective layer 40a, and the insulating layer 40b may be applied to the first and second conductive type regions 32 and 34 formed on the same plane, the first and second electrodes 42 and 44, and the protective layer 40a and the insulating layer 40b disposed on both of the first and second conductive type regions 32 and 34.

The protective layer 40a may be formed on the first and second conductive type regions 32 and 34 and the barrier region 36, and the insulating layer 40b may be formed on the protective layer 40a. The insulating layer 40b includes a first opening (or first openings) 402 to connect the first conductive type region 32 and the first electrode 42 and a second opening (second openings) 404 to connect the second conductive type region 34 and the second electrode 44. Thereby, the insulating layer 40b may prevent electrodes to which the first and second conductive type regions 32 and 34 must not be connected (i.e., the second electrode 44 for the first conductive type region 32 and the first electrode 42 for the second conductive type region 34) from being connected to each other. The protective layer 40b is positioned between the insulating layer 40b and the conductive type regions 32 and 34 and barrier region 36 on the conductive type regions 32 and 34 and barrier region 36. The protective layer 40a can prevent the conductive type regions 32 and 34 from being damaged when the first and second openings 402 and 404 are formed at the insulating layer 40b. In addition, the protective layer 40a can passivate the conductive type regions 32 and 34.

The protective layer 40a is disposed between the conductive type regions 32 and 34 and the insulating layer 40b at portions where the electrodes 42 and 44 are not formed, and is disposed between the conductive type regions 32 and 34 and the electrodes 42 and 44 at portions where the electrodes 42 and 44 are formed. For example, the protective layer 40a is disposed between the conductive type regions 32 and 34 and the insulating layer 40b and is in contact with the conductive type regions 32 and 34 and the insulating layer 40b, and is disposed between the conductive type regions 32 and 34 and the electrodes 42 and 44 and is in contact with the conductive type regions 32 and 34 and the electrodes 42 and 44 at portions where the electrodes 42 and 44 are formed.

As described above, the protective layer 40a prevents the conductive type regions 32 and 34 from being damaged when the first and second openings 402 and 404 are formed at the insulating layer 40b. If the protective layer 40a is not formed unlike the embodiment of the invention, a part of the conductive type regions 32 and 34 formed under the insulating layer 40b may be eliminated or the property of the conductive type regions 32 and 34 may be deteriorated, when the first and second openings 402 and 404 are formed by eliminating a part of the insulating layer 40b so that the first and second openings 402 and 404 penetrate the insulating layer 40b through etching and so on. If the conductive type regions 32 and 34 are damaged, the property and the efficiency of the solar cell 150 decrease. Considering this, in the embodiment of the invention, the protective layer 40a is disposed on the conductive type regions 32 and 34, and thus, a material, an object, and so on for eliminating the insulating layer 40b contacts the protective layer 40a and does not contact the conductive type regions 32 and 34. Accordingly, the damage of the conductive type regions 32 and 34 can be effectively prevented.

Thus, an etched trace that may be generated during the forming of the first and second openings 402 and 404 is formed at an upper surface (that is, a surface where the electrodes 42 and 44 are connected or in contact with) of the protective layer 40a. The etched trace may be one of various traces being formed by various etching methods and having various shapes and various properties. The etched trace may be recognized or detected by several methods.

For example, in the embodiment of the invention, the first and second openings 402 and 404 may be formed by a laser ablation (or laser etching), and thus, a laser-etched trace may be formed at the protective layer 40a (particularly, the upper surface of the protective layer 40a). Although the laser ablation is performed under a condition not to eliminate the protective layer 40a, the laser-etched trace may be formed on the upper surface of the protective layer 40a by errors in a manufacturing process. Since the first and second openings 402 and 404 are formed by melting a part of the insulating layer 40b during the laser ablation, the laser-etched trace may be a trace that is melted and then is solidified, or a trace that is a part of the upper surface of the protective layer 40a exploded or popped (or ablated) and then solidified. Selectively, as shown in FIG. 2, a part of the upper surface of the protective layer 40a may be eliminated during the laser ablation, and thus, a depressed portion R depressed towards the conductive type regions 32 and 34 may be formed at the protective layer 40a. The depressed portion R may be the laser-etched trace. The depressed portion R has a depth corresponding to 10% to 20% of a thickness of the protective layer 40a. That is, a thickness of the protective layer 40a at a first portion where the depressed portion R is formed is 80% or 90% of a thickness of the protective layer 40a at a second portion where the depressed portion R is not formed, since the first portion has small thickness than the second portion by 10% to 20%. However, the embodiment of the invention is not limited thereto, and thus, the depth of the depressed portion R may be varied. Also, various patterns or properties that can be expected to be formed by the laser ablation can be regarded as the laser-etched trace.

In the embodiment of the invention, the depressed portion R is formed by the laser ablation. However, the embodiment of the invention is not limited thereto. That is, the depressed portions R may be formed at the protective layer 40a to correspond to the first and second openings 402 and 404 by a separate process from the laser ablation. Then, a thickness of the protective layer 40a where the electrodes 42 and 44 are connected through the first and second openings 402 and 404 can be reduced. Thus, the tunneling through the protective layer 40a can smoothly generate. In this instance, the thickness of the protective layer 40a where the first and second openings 402 and 404 are formed can be controlled to have a desired thickness. However the embodiment of the invention is not limited thereto.

Further, the protective layer 40a prevents the conductive type regions 32 and 34 from being damaged during various processes performed after the first and second openings 402 and 404. For example, when the electrodes 42 and 44 are formed in the first and second openings 402 and 404 by sputtering, exposed surfaces through the first and second openings 402 and 404 are exposed to plasma. When the protective layer 40a is not formed unlike the embodiment of the invention, the conductive type regions 32 and 34 are directly exposed to the plasma, and thus, the surface of the conductive type regions 32 and 34 may be damaged. On the other hand, when the protective layer 40a is formed as in the embodiment of the invention, the conductive type regions 32 and 34 are prevented from being directly exposed to the plasma and from being damaged by the plasma. In addition, the protective layer 40a can passivate the surface of the conductive type regions 32 and 34, thereby enhancing the passivation property of the conductive type regions 32 and 34.

The protective layer 40a may be formed over a substantially entire portion of the conductive type regions 32 and 34. Accordingly, the protective layer 40a may be easily formed without a separate patterning, and thus, a process can be simplified. The passivation property by the protective layer 40a can be enhanced.

The electrodes 42 and 44 are connected to the conductive type regions 32 and 34 while interposing the protective layer 40a between the electrodes 42 and 44 and the conductive regions 32 and 34. In this instance, the protective layer 40a acts as a tunneling layer, and thus, enables carriers to be smoothly transferred to the electrodes 42 and 44 by tunneling effects. That is, in the embodiment of the invention, the tunneling layer 20 is disposed between the semiconductor substrate 10 and the conductive type regions 32 and 34, and the protective layer 40a acting as a tunneling layer is disposed between the conductive type regions 32 and 34 and the electrodes. Thereby, the carrier can be transferred by the tunneling effects at portions between the semiconductor substrate 10 and the conductive type regions 32 and 34 and between the conductive type regions 32 and 34 and the electrodes 42 and 44 that are paths of the carrier. Thus, the passivation property can be enhanced and the carrier can be smoothly transferred.

To have sufficient tunneling effects, the protective layer 40a (more particularly, the second portion of the protective layer 40a where the depressed portion R is not formed) may have a thickness T2 is smaller than the thickness of the insulating layer 40b. For example, the thickness T2 of the protective layer 40a may be 10 nm or less, for example, 0.5 nm to 10 nm (more particularly, 0.5 nm to 5 nm, e.g., 1 nm to 4 nm). When the thickness T2 of the protective layer 40a exceeds 10 nm, tunneling does not smoothly occur and thus the solar cell 150 may not operate. On the other hand, when the thickness T2 of protective layer 40a is less than 0.5 nm, the protective layer 40a may be penetrated when the first and second openings 402 and 404, and thus, the protective layer 40 may not protect the first and second conductive type regions 32 and 34. To further improve the tunneling effects and prevent the penetration of the protective layer 40a, the thickness T2 of the protective layer 40a may be 1 nm to 3 nm. However, the embodiment of the invention is not limited to the above examples and the thickness T2 of the protective layer 40 may have various values (for example, 50 nm or less).

The insulating layer 40b may be disposed on the protective layer 40a where the electrodes 42 and 44 are not formed. The insulating layer 40b has a thickness larger than the tunneling layer 20 and the protective layer 40a. Then, the insulating property and the passivation property can be enhanced. The insulating layer 40b may have the first and second openings 402 and 404 to correspond to portions where the electrodes 42 and 44 are formed.

When the first and second openings 402 and 404 are formed, the insulating layer 40b is eliminated and the protective layer 40a is maintained. Various methods are used for the above, for example, the protective layer 40a may have a band gap different from a band gap of the insulating layer 40b in the instance that the first and second openings 402 and 404 are formed by the laser ablation. That is, the protective layer 40a has a band gap larger than band gaps of the conductive type regions 32 and 34 and a band gap of the insulating layer 40b, and the laser used for the laser ablation has a band gap (e.g., a wavelength of light) between the band gap of the insulating layer 40b and the protective layer 40a. Since the band gap of the laser is related to a wavelength of light of the laser, a value that is converted from the wavelength of light of the laser is used for the band gap of the laser. Then, the insulating layer 40a having the band gap smaller than the band gap of the laser is melt and eliminated, and the laser passes through the protective layer 40b having the band gap larger than the band gap of the laser and the protective layer 40b is maintained. Therefore, the first and second openings 402 and 404 are formed at the insulating layer 40b during the laser ablation, and the protective layer 40a is originally maintained or has only the laser-etched trace.

For reference, when the conductive type regions 32 and 34 comprises polycrystalline semiconductor layer, the conductive type regions 32 and 34 have the band gaps of about 1.12 eV, which are the same as or smaller than the band gap of the insulating layer 40b. Therefore, when the protective layer 40a is not included, at least apart of the conductive type regions 32 and 34 are etched or eliminated during the etching of the insulating layer 40b, and thus, the conductive type regions 32 and 34 may be damaged. On the other hand, in the embodiment of the invention, the protective layer 40a having the band gap larger than the conductive type regions 32 and 34 is included, and therefore, the conductive type regions 32 and 34 are protected without being etched during the etching of the insulating layer 40b.

For example, the protective layer 40a may have the band gap of about 3 eV or more, and the insulating layer 40b may have the band gap smaller than about 3 eV. More particularly, the protective layer 40a may have the band gap of about 5 eV or more (for example, about 5 eV to about 10 eV), and the insulating layer 40b may have the band gap of about 0.5 eV or more and about 3 eV or less. This is determined to consider the wavelength of the laser during the laser ablation, and the band gaps may be varied if the wavelength of the laser is varied. The laser during the laser ablation will be described in more detail in a method of manufacturing the solar cell 150. The embodiment of the invention is not limited to only that discussed herein.

Various methods may be used for adjusting the band gap. In the embodiment of the invention, a material of the protective layer 40a is different from a material of the insulating layer 40b, considering that the band gaps are different according to the materials. For example, the protective layer 40a may include an oxide having a relatively high band gap (for example, a silicon oxide, an aluminum oxide, a titanium oxide, and so on) or amorphous silicon. Because the oxide has the high band gap of about 5 eV or more (for example, about 8 eV to about 9 eV), the oxide can be maintained without being etched during the laser ablation. The amorphous silicon also has the high band gap of about 3 eV or more, and thus, can be maintained without being etched during the laser ablation. The protective layer 40a may be a single layer or may be have a multilayer structure including two or more layers.

The insulating layer 40b may include a nitride and/or a carbide having a relatively low band gap (for example, a silicon nitride, a silicon carbide, and so on). The silicon nitride or the silicon carbide generally has the low band gap smaller than about 3 (for example, about 0.5 eV to about 3 eV) although the band gap may be different from a composition of the silicon nitride or the silicon carbide. The insulating layer 40b may be a single layer or may be have a multilayer structure including two or more layers.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In the embodiment of the invention, the first electrode 42 is connected to the first conductive type region 32 through penetrating of the first opening 402 of the insulating layer 40b, while interposing the protective layer 40a. The second electrode 44 is connected to the second conductive type region 34 through penetrating of the second opening 404 of the insulating layer 40b, while interposing the protective layer 40a. The first and second electrodes 42 and 44 may include various metal materials. In addition, the first and second electrodes 42 and 44 are not electrically connected to each other but are respectively connected to the first conductive type region 32 and the second conductive type region 34, and may have various planar shapes enabling collection of carriers generated and transfer of the collected carriers to the outside. However, the shapes of the first and second electrodes 42 and 44 are not limited to the above example.

Hereinafter, a stacked structure of the first electrode 42 and/or the second electrode 44 will be described in detail with reference to an enlarged circle of FIG. 2, and the planar structure of the first electrode 42 and/or the second electrode 44 will be described in detail with reference to FIG. 3. The first electrode 42 will be described below with reference to the enlarged circle of FIG. 2 by way of example, but the second electrode 44 may also have the same or similar structure as that of the first electrode 42. That is, the stacked structure of the first electrode 42 may also be applied to the second electrode 44.

Referring to the enlarged circle of FIG. 2, the first electrode 42 contacts the protective layer 40a formed on the first conductive type region 32 formed as a semiconductor layer (the second conductive type region 34 in the instance of the second electrode 44) and may include an adhesive layer 420 that is transparent and conductive and an electrode layer 422 formed on the adhesive layer 420. In this regard, the electrode layer 422 basically acts as an electrode that collects carriers generated by photoelectric conversion and transfers the collected carriers to the outside, and the adhesive layer 420 may enhance contact property and adhesion property of the protective 40a and the semiconductor layer with the electrode layer 422.

The adhesive layer 420 may be formed between the protective layer 40a and the electrode layer 422 in contact therewith. The adhesive layer 420 has conductivity and may include a metal having excellent contact characteristics with the semiconductor layer and the protective layer 40a. Accordingly, conductivity of the first electrode 42 need not be reduced and adhesion between the protective layer 40a and the electrode layer 422 may be enhanced. To enhance contact characteristics with the first and second conductive type regions 32 and 34, the adhesive layer 420 may have a coefficient of thermal expansion between a coefficient of thermal expansion of the first and second conductive type regions 32 and 34 and a coefficient of thermal expansion of a portion of the electrode layer 422 adjacent to the adhesive layer 420. Although the adhesion layer 420 is not in direct contact with the first and second conductive type regions 32 and 34, the properties of the first and second conductive type regions 32 and 34 may be considered with respect to the properties such as the coefficient of thermal expansion since the protective layer 40a has a small thickness.

More particularly, when a difference between the coefficients of thermal expansion of the first and second conductive type regions 32 and 34 and the first electrode 42 is large, interfacial contact between the first and second conductive type regions 32 and 34 and the first electrode 42 may be deteriorated when various heat treatment processes for forming the solar cell 150 are performed. Accordingly, a contact resistance between the first and second conductive type regions 32 and 34 and the first electrode 42 may be increased. This may be more problematic when a contact area between a line width of the semiconductor layer or the first electrode 42 is small and the contact area between the first and second conductive type regions 32 and 34 and the first electrode 42 is small. Thus, in the embodiment of the invention, a coefficient of thermal expansion difference between the first and second conductive type regions 32 and 34 and the first electrode 42 is reduced by restricting a coefficient of thermal expansion of the adhesive layer 420 of the first electrode 42 adjacent to first and second conductive type regions 32 and 34, which results in enhanced interfacial contact characteristics.

The first and second conductive type regions 32 and 34 has a coefficient of thermal expansion of about 4.2 ppm/K when including silicon, and copper (Cu), aluminum (Al), silver (Ag), gold (Au), or the like that may constitute the portion of the electrode layer 422 adjacent to the adhesive layer 420 (e.g., in the embodiment of the invention, a first electrode layer 422a) has a coefficient of thermal expansion of approximately 14.2 ppm/K or more. More particularly, Cu has a coefficient of thermal expansion of about 16.5 ppm/K, Al has a coefficient of thermal expansion of about 23.0 ppm/K, Ag has a coefficient of thermal expansion of about 19.2 ppm/K, and Au has a coefficient of thermal expansion of about 14.2 ppm/K.

Considering this, a material (e.g., a metal) constituting the adhesive layer 420 may have a coefficient of thermal expansion of about 4.5 ppm/K to about 14 ppm/K. When the coefficient of thermal expansion of the material is less than 4.5 ppm/K or exceeds 14 ppm/K, a difference between the coefficients of thermal expansion of the adhesive layer 420 and the semiconductor layer is reduced and thus adhesion enhancement effects may be insufficient. Considering this, the adhesive layer 420 may include titanium (Ti) having a coefficient of thermal expansion of about 8.4 ppm/K or tungsten (W) having a coefficient of thermal expansion of about 4.6 ppm/K. For example, the adhesive layer 420 may be formed of Ti or W. However, the embodiment of the invention is not limited thereto.

As such, when the adhesive layer 420 includes Ti or W, contact characteristics may be enhanced by reducing a difference between the coefficients of thermal expansion of the adhesive layer 420 and the first and second conductive type regions 32 and 34. In addition, Ti or W may act as a barrier of a material (e.g., Cu or the like) constituting the portion (e.g., in the embodiment of the invention, the first electrode layer 422a) of the electrode layer 422 adjacent to the adhesive layer 420 and thus may prevent the material from diffusing into the first and second conductive type regions 32 and 34 or the semiconductor substrate 10. Accordingly, problems that may occur through diffusion of the material constituting the electrode layer 422 into the first and second conductive type regions 32 and 34 or the semiconductor substrate 10 may be prevented or reduced.

In this regard, the adhesive layer 420 according to the embodiment of the invention may have transparency, which allows light to pass therethrough. When the adhesive layer 420 has a small thickness even when including a metal, the adhesive layer 420 may have transparency. Thus, in the embodiment of the invention, the adhesive layer 420 may have light transmitting properties by restricting the thickness of the adhesive layer 420 to a certain level or less. When the adhesive layer 420 has transparency, light having passed through the adhesive layer 420 is directed back into the semiconductor substrate 10 by reflection from the electrode layer 422 formed on the adhesive layer 420 or a layer constituting a portion of the electrode layer 422 (e.g., the first electrode layer 422a). Due to reflection of light from the first electrode 42, the amount and residence time of light present in the semiconductor substrate 10 is increased and, accordingly, efficiency of the solar cell 150 may be enhanced.

The term "transparency" as used herein includes an instance in which light is completely (i.e., 100%) transmitted and an instance in which light is partially transmitted. That is, the adhesive layer 420 may be a metal transparent layer or a metal semi-transparent layer. For example, the adhesive layer 420 may have a transparency of 50% to 100%, more particularly 80% to 100%. When the transparency of the adhesive layer 420 is less than 50%, the amount of light reflected from the electrode layer 422 is insufficient and thus it may be difficult to sufficiently enhance the efficiency of the solar cell 150. When the transparency of the adhesive layer 420 is 80% or more, the amount of light reflected from the electrode layer 422 may be further increased and thus may further contribute to improvement in the efficiency of the solar cell 150.

For this operation, the adhesive layer 420 may have a smaller thickness than the electrode layer 422. As in the embodiment of the invention, when the electrode layer 422 includes a plurality of layers (e.g., the first electrode layer 422a, a second electrode layer 422b, a third electrode layer 422d, and a seed electrode layer 422c), the adhesive layer 420 may have a smaller thickness than each of the layers. Thus, the adhesive layer 420 may be formed so as to have transparency.

In particular, the adhesive layer 420 may have a thickness of 50 nm or less. When the thickness of the adhesive layer 420 exceeds 50 nm, the transparency of the adhesive layer 420 is reduced and thus the amount of light directed to the electrode layer 422 may be insufficient. The transparency of the adhesive layer 420 may be further enhanced by forming the adhesive layer 420 to a thickness of 15 nm or less. In this regard, the thickness of the adhesive layer 420 may be between 5 nm and 50 nm (e.g., between 5 nm and 15 nm). When the thickness of the adhesive layer 420 is less than 5 nm, it may be difficult to uniformly form the adhesive layer 420 and adhesion enhancement effects obtained by the adhesive layer 420 may be insufficient. However, the embodiment of the invention is not limited to the above examples and the thickness and the like of the adhesive layer 420 may vary in consideration of materials, manufacturing conditions, and the like.

The electrode layer 422 formed on the adhesive layer 420 may include a plurality of layers so as to enhance various characteristics and the like. In the embodiment of the invention, the electrode layer 422 includes the first electrode layer 422a formed on the adhesive layer 420 and including a reflective material and the second electrode layer 422b formed on the first electrode layer 422a and connected to (e.g., contacting) the ribbon 144. In addition, the electrode layer 422 may further include the seed electrode layer 422c and the third electrode layer 422d that are formed between the first electrode layer 422a and the second electrode layer 422b. Hereinafter, the layers constituting the electrode layer 422 will be described according to the stacking sequence.

The first electrode layer 422a formed on the adhesive layer 420 may contact the adhesive layer 420. The first electrode layer 422a acts as a barrier that prevents a material constituting the electrode layer 422 from migrating to the first and second conductive type regions 32 and 34 or the semiconductor substrate 10 and reflects light by a reflective material. That is, the first electrode layer 422a may act as both a barrier layer and a reflective electrode layer. The first electrode layer 422a may be formed of a metal having excellent reflection properties and may include, for example, Cu, Al, Ag, Au, or an alloy thereof. When the seed electrode layer 422c including Cu or the like or formed of Cu is disposed on the first electrode layer 422a, the first electrode layer 422a may include Al, Ag, Au, or an alloy thereof or be formed of Al, Ag, Au, or an alloy thereof.

The first electrode layer 422a has a greater thickness than the adhesive layer 420 and may have a thickness of 50 nm to 300 nm. For example, the first electrode layer 422a may have a thickness of 100 nm to 300 nm. When the thickness of the first electrode layer 422a is less than 50 nm, it may be difficult for the first electrode layer 422a to act as a barrier layer and a reflective electrode layer. When the thickness of the first electrode layer 422a exceeds 300 nm, reflection properties and the like are not significantly enhanced and manufacturing costs may be increased. When the thickness of the first electrode layer 422a is between 100 nm and 300 nm, function of the first electrode layer 422a as a barrier layer and a reflective electrode layer may be further enhanced.

In addition, a thickness ratio of the adhesive layer 420 to the first electrode layer 422a may be 1:2 to 1:60. More particularly, the thickness ratio of the adhesive layer 420 to the first electrode layer 422a may be 1:10 to 1:30. When the thickness ratio is less than 1:2, the thickness of the adhesive layer 420 increases and thus transparency thereof may be reduced or the thickness of the first electrode layer 422a decreases and thus reflection properties and the like may be deteriorated. On the other hand, when the thickness ratio exceeds 1:60, the thickness of the first electrode layer 422a increases and thus manufacturing costs may be increased. When the thickness ratio is 1:10 to 1:30, characteristics of both the adhesive layer 420 and the first electrode layer 422a may be enhanced. However, the embodiment of the invention is not limited to the above examples, and the thickness ratio, and the like may be variously changed.

The seed electrode layer 422c disposed on the first electrode layer 422a acts as a seed of the third electrode layer 422d (the second electrode layer 422b when the third electrode layer 422d is not formed) formed on the seed electrode layer 422c and enables the third electrode layer 422d to be easily formed. That is, the seed electrode layer 422c is disposed between the first electrode layer 422a and the third electrode layer 422d and may be in contact therewith.

The third electrode layer 422d may be formed by plating or the like, and the seed electrode layer 422c is formed between the first electrode layer 422a and the third electrode layer 422d so that the third electrode layer 422d is satisfactorily formed by plating. When the third electrode layer 422d includes Cu, the seed electrode layer 422c may include Cu or be formed of Cu. The third electrode layer 422d formed so as to include Cu by plating uses the seed electrode layer 422c as a seed and thus may be easily formed and have excellent characteristics.

The seed electrode layer 422c may have a thickness of 50 nm to 200 nm. When the thickness of the seed electrode layer 422c is less than 50 nm, effects obtained by the seed electrode layer 422c may be insufficient. On the other hand, when the thickness of the seed electrode layer 422c exceeds 200 nm, manufacturing costs and the like may be increased. However, the embodiment of the invention is not limited to the above examples and the thickness and the like of the seed electrode layer 422c may be variously changed.

The adhesive layer 420, the first electrode layer 422a, and the seed electrode layer 422c may be formed by sputtering or the like. When the first electrode 42 is formed by the sputtering, the protective layer 40a can prevent the conductive type regions 32 and 34 from being damaged. More particularly, the adhesive layer 420, the first electrode layer 422a, and the seed electrode layer 422c of the first electrode 42 (and/or the second electrode 44) may be formed by entirely forming metal layers respectively constituting the adhesive layer 420, the first electrode layer 422a, and the seed electrode layer 422c so as to fill the first opening 402 (the second opening 404 in the instance of the second electrode 44) of the insulating layer 40b formed on the first and second conductive type regions 32 and 34 formed as semiconductor layers and the barrier region 36 and patterning the metal layers. The patterning process may be performed using various methods, e.g., a method using a resist and an etchant.

The adhesive layer 420, the first electrode layer 422a, and the seed electrode layer 422c, formed by sputtering, are mostly stacked in a thickness direction and thus have a uniform thickness. In addition, the metal layers respectively corresponding to the adhesive layer 420, the first electrode layer 422a, and the seed electrode layer 422c are sequentially and entirely formed and then patterned together using the same resist (or mask). Thus, side cross-sections of at least parts of at least two of the adhesive layer 420, the first electrode layer 422a, and the seed electrode layer 422c may be continuously formed. In addition, the at least parts of the at least two of the adhesive layer 420, the first electrode layer 422a, and the seed electrode layer 422c may have area error within 10% (e.g., within 5%). It can be confirmed that the adhesive layer 420, the first electrode layer 422a, and the seed electrode layer 422c are formed by sputtering and patterned together according to thicknesses, shapes, an area difference, and the like. However, the embodiment of the invention is not limited to the above examples, and the adhesive layer 420, the first electrode layer 422a, and the seed electrode layer 422c may be formed using various methods.

The third electrode layer 422d may be formed on the seed electrode layer 422c in contact therewith. The third electrode layer 422d serves to reduce resistance of the electrode layer 422 and increase electrical conductivity thereof and thus may act as a conductive layer to substantially transfer current. The third electrode layer 422d may include a metal (e.g., Cu) that is inexpensive and highly conductive. However, the embodiment of the invention is not limited to the above example, and various known metals may be used to form the third electrode layer 422d.

The third electrode layer 422d may have a greater thickness than the adhesive layer 420, the first electrode layer 422a, the seed electrode layer 422c, and the second electrode layer 422b. For example, the third electrode layer 422d may have a thickness of 20 μm to 30 μm. When the thickness of the third electrode layer 422d is less than 20 μm, it may be difficult to sufficiently reduce resistance. On the other hand, when the thickness of the third electrode layer 422d exceeds 30 μm, manufacturing time may be increased and, accordingly, manufacturing costs may be increased.

The third electrode layer 422d may be formed by plating using the seed electrode layer 422c as a seed. As such, when the third electrode layer 422d is formed by plating, the third electrode layer 422d having a sufficient thickness may be formed within a short time. The third electrode layer 422d formed by plating grows both in a thickness direction and in a side direction and thus is convexly formed so as to have a wider area than the adhesive layer 420, the first electrode layer 422a, and the seed electrode layer 422c and, consequently, may have a rounded surface. However, the embodiment of the invention is not limited to the above examples and a formation method, shape and the like of the third electrode layer 422d may be variously changed.

Figure 4:
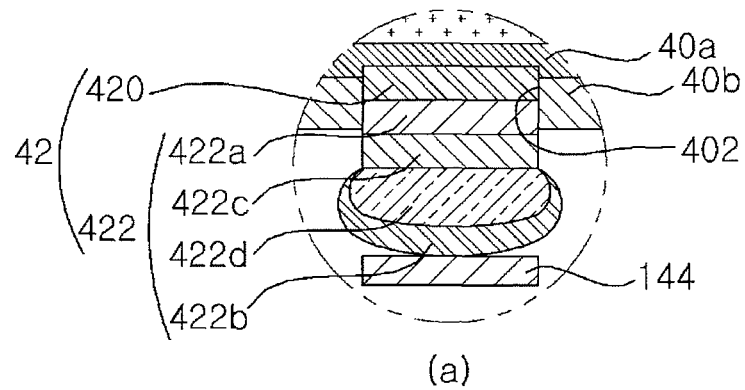
FIG. 4 illustrates schematic enlarged views illustrating various examples of an adhesion structure between a first electrode and a ribbon of a solar cell according to an embodiment of the invention.
Figure 4:
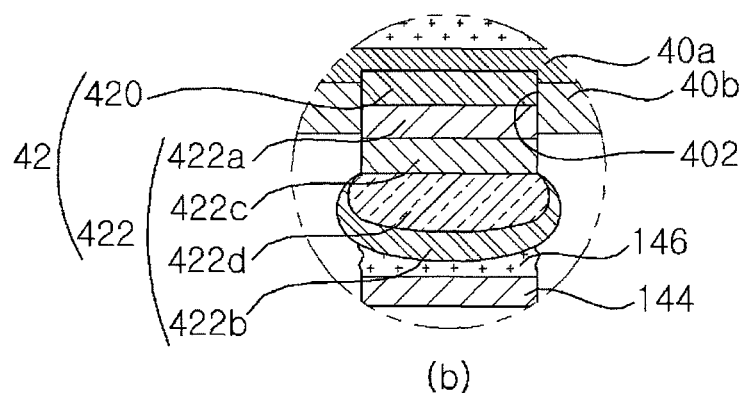
Figure 4:
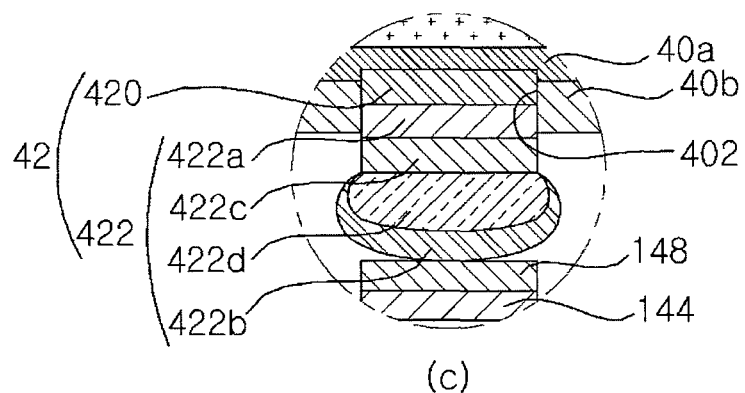

The second electrode layer 422b may be formed on the third electrode layer 422d. For example, the second electrode layer 422b may contact the third electrode layer 422d thereon. The second electrode layer 422b is a portion connected to the ribbon 144 and may include a material having excellent connection properties with the ribbon 144. Various examples of a connection structure between the second electrode layer 422b and the ribbon 144 will be described with reference to FIG. 4. FIG. 4 illustrates enlarged views illustrating various examples of an adhesion structure between the first electrode 42 of the solar cell 150 and the ribbon 144. For clear and brief explanation, a shape of the first electrode 42 of FIG. 4 is illustrated based on the shape of the first electrode 42 illustrated in an enlarged circle of FIG. 2.

In an embodiment of the invention, as illustrated in (a) of FIG. 4, the ribbon 144 may be directly attached to the second electrode layer 422b by disposing the ribbon 144 including, for example, lead (Pb) and tin (Sn) on the second electrode layer 422b and applying heat thereto. In another embodiment of the invention, as illustrated in (b) of FIG. 4, the second electrode layer 422b may be attached to the ribbon 144 via a paste layer 146 by applying heat in a state in which a paste (e.g., a paste including Sn, Bi, and the like) is disposed between the second electrode layer 422b and the ribbon 144. In another embodiment of the invention, as illustrated in (c) of FIG. 4, the second electrode layer 422b may be attached to the ribbon 144 via a conductive layer 148 by applying pressure in a state in which the conductive layer 148 is disposed between the second electrode layer 422b and the ribbon 144. The conductive layer 148 may be prepared by dispersing conductive particles formed of Au, Ag, nickel (Ni), Cu, or the like, which are highly conductive, in a layer formed of epoxy resin, acryl resin, polyimide resin, polycarbonate resin, or the like. When such a conductive layer is pressed while applying heat, conductive particles are exposed to outside of the layer and the solar cell 150 and the ribbon 144 may be electrically connected by the exposed conductive particles. As such, when a solar cell module is manufactured by connecting plural solar cells 150 by a conductive layer, manufacturing temperature may be reduced and thus bending of the solar cell 150 may be prevented or reduced. The second electrode layer 422b and the ribbon 144 may be attached and connected to each other by various other methods.

Referring to FIG. 2 again, the second electrode layer 422b may include Sn or a Nickel-Vanadium (Ni—V) alloy. Sn has excellent adhesion with the ribbon 144, a paste for connection with the ribbon 144, or the like. In addition, the Ni—V alloy has excellent adhesion with the ribbon 144 or a paste for connection with the ribbon 144. More particularly, in a paste including Sn and Bi, Sn of the paste has very high adhesion with Ni of the Ni—V alloy. In addition, a Ni—V alloy has a very high melting point of about 1000° C. or more and thus has a higher melting point than materials of the other layers constituting the electrode layer 422. Thus, the second electrode layer 422b is not deformed during adhesion to the ribbon 144 or manufacturing of the solar cell 150 and may sufficiently act as a capping layer to protect the other layers constituting the electrode layer 422.

The second electrode layer 422b may be formed using various methods. In the embodiment of the invention, the second electrode layer 422b is formed by plating and includes Sn. The second electrode layer 422b may have a thickness of 5 μm to 10 μm and may be formed so as to cover the first electrode layer 422a and have a convexly rounded shape. When the thickness of the second electrode layer 422b is less than 5 μm, it may be difficult to uniformly form the second electrode layer 422b. On the other hand, when the thickness of the second electrode layer 422b exceeds 10 μm, manufacturing costs may be increased. However, the embodiment of the invention is not limited to the above examples. An instance in which the second electrode layer 422b is formed by sputtering and includes Sn or a Ni—V alloy will be described below in detail with reference to FIG. 7.

Hereafter, planar shapes of the first and second conductive type regions 32 and 34, the barrier region 36, and the first and second electrodes 42 and 44 will be described in detail with reference to FIG. 3.

Referring to FIG. 2 and FIG. 3, in the embodiment of the invention, the first and second conductive type regions 32 and 34 are formed long so as to have a stripe shape and alternately disposed with respect to each other in a direction crossing a longitudinal direction. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples.

In this regard, the first conductive type region 32 may have a wider area than the second conductive type region 34. For example, the areas of the first and second conductive type regions 32 and 34 may be adjusted by differently adjusting widths thereof. That is, a width W1 of the first conductive type region 32 may be greater than a width W2 of the second conductive type region 34. Thus, the area of the first conductive type regions 32 constituting an emitter region is sufficiently formed, which enables photoelectric conversion to occur in a wide region. In this regard, when the first conductive type regions 32 are of a p-type, the area of the first conductive type regions 32 is sufficiently secured and thus holes having a relatively slow movement rate may be effectively collected.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 may be formed to respectively correspond to total lengths of the first and second electrodes 42 and 44. Thus, a contact area between the first electrode 42 and the first conductive type region 32 and a contact area between the second electrode 44 and the second conductive type region 34 are maximized and, accordingly, carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 2, the passivation layer 24 and/or the anti-reflective layer 26 may be disposed on the front surface of the semiconductor substrate 10 (more particularly, the front surface field region 130 formed at the front surface of the semiconductor substrate 10). According to embodiments of the invention, only the passivation layer 24 may be formed on the semiconductor substrate 10, only the anti-reflective layer 26 may be formed on the semiconductor substrate 10, or the passivation layer 24 and the anti-reflective layer 26 may be sequentially disposed on the semiconductor substrate 10. FIG. 2 illustrates an instance in which the passivation layer 24 and the anti-reflective layer 26 are sequentially formed on the semiconductor substrate 10 and the semiconductor substrate 10 contacts the passivation layer 24. However, the embodiment of the invention is not limited to the above examples, and the semiconductor substrate 10 may contact the anti-reflective layer 26. In addition, various modifications are possible.

The passivation layer 24 and the anti-reflective layer 26 may be substantially entirely formed on the front surface of the semiconductor substrate 10. In this regard, the expression "entirely formed" as used herein includes an instance in which the passivation layer 24 and the anti-reflective layer 26 are physically completely formed and an instance in which the passivation layer 24 and the anti-reflective layer 26 are incompletely formed.

The passivation layer 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage of the solar cell 150 may be increased. The anti-reflective layer 26 reduces reflectance of light incident upon the front surface of the semiconductor substrate 10. Thus, the amount of light reaching a pn junction formed at an interface between the base region 110 and the first conductive type region 32 may be increased by reducing the reflectance of light incident upon the front surface of the semiconductor substrate 10. Accordingly, a short-circuit current Isc of the solar cell 150 may be increased. As such, the open circuit voltage and the short-circuit current Isc of the solar cell 150 may be increased by the passivation layer 24 and the anti-reflective layer 26 and, accordingly, the efficiency of the solar cell 150 may be enhanced.

The passivation layer 24 and/or the anti-reflective layer 26 may be formed of various materials. For example, the passivation layer 24 may be any one layer selected from the group consisting of a silicon nitride layer, a hydrogen-containing silicon nitride layer, a silicon oxide layer, a silicon oxynitride layer, an aluminum oxide layer, a $MgF_2$ layer, a ZnS layer, a $TiO_2$ layer, and a $CeO_2$ layer or have a multilayer structure including two or more of the above-listed layers in combination. For example, the passivation layer 24 may include silicon oxide, and the anti-reflective layer 26 may include silicon nitride.

When light is incident upon the solar cell 150 according to the embodiment of the invention, electrons and holes are generated by photoelectric conversion at the pn junction formed between the base region 110 and the first conductive type region 32, and the generated holes and electrons tunnel by tunneling through the tunneling layer 20, respectively move to the first and second conductive type regions 32 and 34 and then respectively migrate to the first and second electrodes 42 and 44 by tunneling through the protective layer 40*a*. Electric energy is generated thereby.

As in the embodiment of the invention, in the solar cell 150 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 may be minimized. Accordingly, efficiency of the solar cell 150 may be enhanced. However, the embodiment of the invention is not limited to the above examples.

As in the embodiment of the invention, the electrodes 42 and 44 are connected to the conductive type regions 32 and 34 while interposing the electrodes 42 and 44. Thereby, the damage of the conductive type regions 32 and 34 can be effectively prevented in a process for forming the first and second openings 420 and 404, and a process for forming the electrodes 42 and 44. In addition, the protective layer 40*a* passivates the conductive type regions 32 and 34, thereby enhancing the passivation property. As such, the protective layer 40*a* protects the conductive type regions 32 and 34 so that the conductive type regions 32 and 34 have superior properties, thereby the efficiency of the solar cell 150. Also, the efficiency of the solar cell 150 can be enhanced more by a stacked structure of the electrodes 42 and 44.

Hereinafter, the manufacturing method of the solar cell 100 having the above structure will be described in detail with reference to FIGS. 5*a* to 5*h*. FIGS. 5*a* to 5*h* are sectional views illustrating a method for manufacturing a solar cell according to an embodiment of the invention.

Figure 5A:
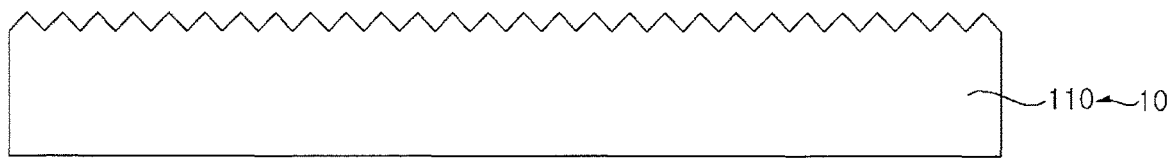
FIGS. 5a to 5h are sectional views illustrating a method for manufacturing a solar cell according to an embodiment of the invention.

First, as shown in FIG. 5*a*, a semiconductor substrate 10 including a base region 110 having a second conductive type dopant is prepared. In the embodiment of the invention, the semiconductor substrate 10 may be a silicon substrate (for example, a silicon wafer) having an n-type dopant. Examples of the n-type dopant include, but are not limited to, Group V elements such as phosphorous (P), arsenic (As), bismuth (Bi) and antimony (Sb). However, the embodiment of the invention is not limited thereto, the base region 110 may have a p-type dopant.

At least one of the front and back surfaces of the semiconductor substrate 10 is textured so that the surface is an uneven surface (or have protruded portions and/or depressed portions). Wet or dry texturing method may be used as the texturing of the surface of the semiconductor substrate 10. Wet texturing may be carried out by dipping the semiconductor substrate 10 in a texturing solution, which has an advantage of a short process time. Dry texturing is a process of cutting the surface of the semiconductor substrate 10 using a diamond drill, laser or the like, which enables formation of uniform protruded portions and/or depressed portions, but disadvantageously has a long process time and causes damage to the semiconductor substrate 10. Alternatively, the semiconductor substrate 10 may be textured by reactive ion etching (RIE) or the like. As such, the semiconductor substrate 10 may be textured by a variety of methods.

For example, the front surface of the semiconductor substrate 10 may be textured to have the protruded portions and/or depressed portions. Meanwhile, the back surface of the semiconductor substrate 10 may be a relatively smooth and even surface formed by mirror polishing or the like, and have a lower surface roughness than the front surface of the semiconductor substrate 10. However, the embodiment of the invention is not limited thereto, and thus, the semiconductor substrate 10 having various structures may be used.

Figure 5B:
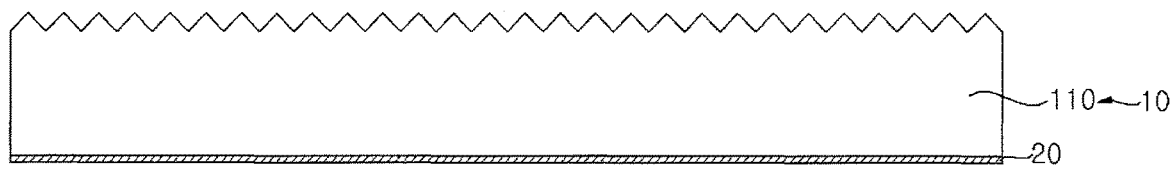

Then, as shown in FIG. 5*b*, a tunneling layer 20 is formed on the rear surface of the semiconductor substrate 10. The tunneling layer 20 may be formed over an entire portion of the semiconductor substrate 10.

In this instance, the tunneling layer 20 may be formed, for example, by a method such as thermal growth or deposition (for example, plasma-enhanced chemical vapor deposition chemical (PECVD), atomic layer deposition (ALD)) or the like, but the embodiment of the invention is not limited thereto and the tunneling layer 20 may be formed by a variety of methods.

Figure 5C:
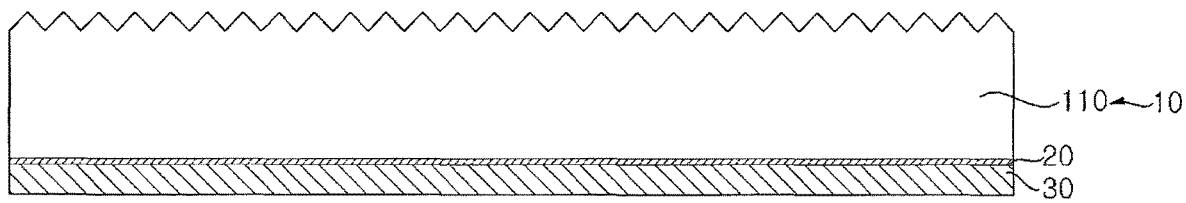
Figure 5D:
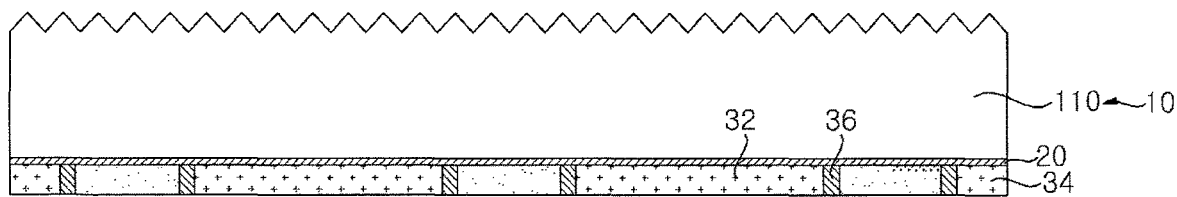

Then, as shown in FIGS. 5*c* and 5*d*, the first conductive type region 32 and the second conductive type region 34 are formed on the tunneling layer 20.

As shown in FIG. 5c, a semiconductor layer 30 is formed on the tunneling layer 20. The conductive type regions 32 and 34 may be formed of an amorphous, microcrystalline, or polycrystalline semiconductor. In this instance, the semiconductor layer 30 may be formed by a method, for example, thermal growth, deposition (for example, plasma-enhanced chemical vapor deposition chemical (PECVD)) or the like. However, the embodiment of the invention is not limited thereto, the semiconductor layer 30 may be formed by various methods.

Next, as shown in FIG. 5d, first conductive type regions 32, second conductive type regions 34, and barrier areas 36 are formed at the semiconductor layer 30.

For example, a region of the semiconductor layer 30 is doped with a first conductive type dopant to form the first conductive type region 32 by various methods such as an ion implantation method, a thermal diffusion method, or a laser doping method, and another region thereof is doped with a second conductive type dopant to form the second conductive type region 34 by various methods such as an ion implantation method, a thermal diffusion method, or a laser doping method. Then, the barrier region 36 may be formed in a region of the semiconductor layer 30 between the first and second conductive type regions 32 and 34.

However, the embodiment of the invention is not limited thereto. Various methods may be used for a method for forming the conductive type regions 32 and 34, and barrier region 36. Also, the barrier region 36 may be not formed. That is, various modifications are possible.

Figure 5E:
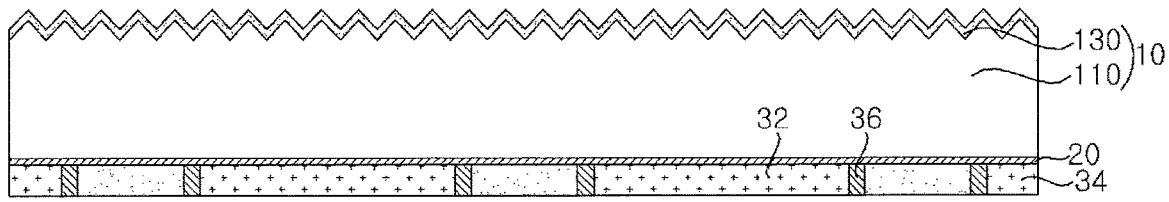

Next, as shown in FIG. 5e, a front surface field region 130 may be formed by doping the second conductive type dopant to the front surface of the semiconductor substrate 10. The front surface field region 130 may be formed by various methods, such as an ion implantation method, a thermal diffusion method, or a laser doping method.

Figure 5F:
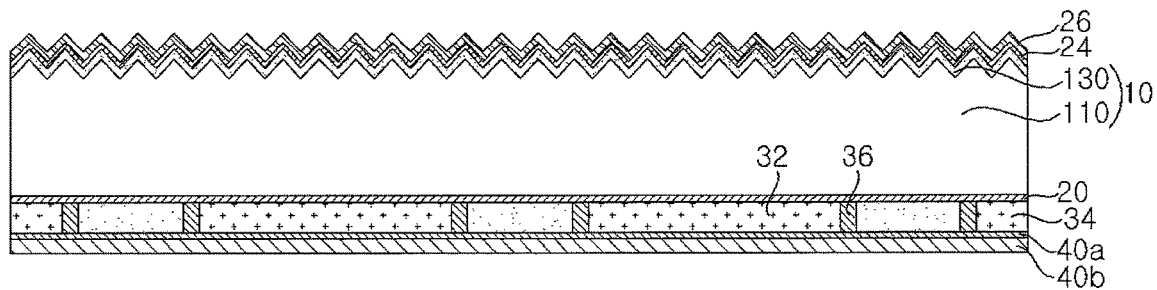

Next, as shown in FIG. 5f, a passivation layer 24 and an anti-reflective layer 26 are sequentially formed on the front surface of the semiconductor substrate 10, and a protective layer 40a and an insulating layer 40b are sequentially formed on the rear surface of the semiconductor substrate 10. That is, the passivation layer 24 and the anti-reflective layer 26 are formed over the entire portion of the front surface of the semiconductor substrate 10, and the protective layer 40a and the insulating layer 40b are formed over the entire portion of the rear surface of the semiconductor substrate 10. The passivation layer 24, the anti-reflective layer 26, the protective layer 40a, and the insulating layer 40b may be formed by a variety of methods such as vacuum deposition, chemical vapor deposition, spin coating, screen printing or spray coating. A formation order of the passivation layer 24 and the anti-reflective layer 26, and the protective layer 40a and the insulating layer 40b may be varied.

Figure 5G:
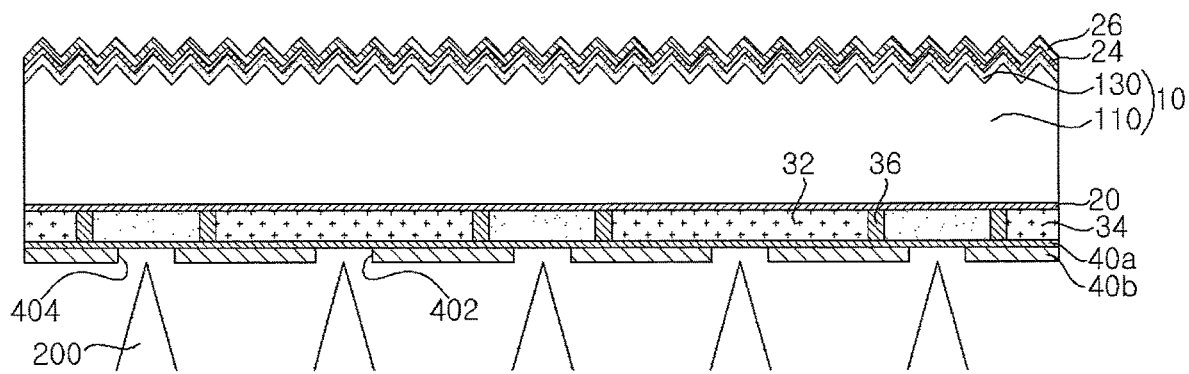

Next, as shown in FIG. 5g, first and second openings 402 and 404 are formed at the insulating layer 40b, while maintaining the protective layer 40a. The first and second openings 402 and 404 may be formed by various methods.

For example, in the embodiment of the invention, the first and second openings 402 and 404 may be formed by a laser ablation (a laser etching) using a laser 200. By using the laser ablation, widths of the first and second openings 402 and 404 can be reduced, and the first and second openings 402 and 404 having various patters can be easily formed. Also, according to types or wavelengths of the laser, the insulating layer 40b can be selectively eliminated while the protective layer 40a is maintained.

In the laser ablation, the laser being able to melt the insulating layer 40b and being not able to melt the protective layer 40a is used. Thus, the protective layer 40a can be maintained, while corresponding portions of the insulating layer 40b can be eliminate to form the first and second openings 402 and 404. In this instance, the laser 200 has a predetermined wavelength, and thus, the laser 200 has a band gap smaller than a band gap of the protective layer 40a and larger than a band gap of the insulating layer 40b. That is, the wavelength of the laser 200 is directly related to the band gap, a value of the band gap that is converted from the wavelength of the laser is smaller than the band gap of the protective layer 40a and larger than the band gap of the insulating layer 40b. For example, the band gap of the laser 200 may be a value of 1.24 eV·μm divided by the wavelength (μm) of the laser 200. However, this may be varied according to types and properties of the laser 200, and thus, the embodiment of the invention is not limited thereto.

As such, in the embodiment of the invention, by controlling the band gaps of the protective layer 40a and the insulating layer 40b, the first and second openings 402 and 404 are formed only at the insulating layer 40b. Thus, a process for selectively etching the insulating layer 40b while maintaining the protective layer 40a can be easily performed.

For example, the laser 200 in the laser ablation has the wavelength of about 1064 nm or less. The laser 200 of the wavelength is larger than 1064 nm may be difficult to generate. For example, in order to easily generate the laser 200 and to easily etch the insulating layer 40b, the laser 200 has the wavelength of about 300 nm to about 600 nm. For example, the laser 200 may be an ultraviolet laser. Since the laser 200 has a laser pulse width of picoseconds, picoseconds (ps) to nanoseconds, or nanoseconds (ns), the laser ablation can be smooth. Particularly, when the laser 200 has the laser pulse width of the picoseconds or the picoseconds (ps) (that is, about 1 ps to about 999 pcs), the laser ablation can be made smoother. Also, the laser 200 has a laser shot mode of a single shot or a burst shot. In the burst shot, one laser is divided a plurality of shots, and the plurality of shots are irradiated. When the burst shot is used, the damage of the protective layer 40a and the conductive type regions 32 and 34 can be minimized. However, the embodiment of the invention is not limited thereto, and thus, various lasers may be used.

Figure 5H:
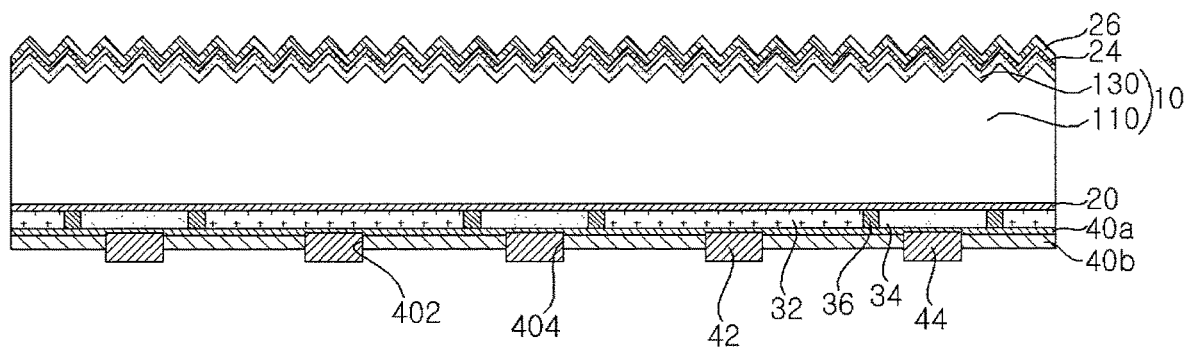

Next, as shown in FIG. 5h, the first and second electrodes 42 and 44 are formed to fill the first and second openings 402 and 404. A stacked structure and a manufacturing method of the first and second electrodes 42 and 44 were described with reference to FIG. 2, and the detailed descriptions are omitted.

In the embodiment of the invention, when the first and second openings 402 and 404 are formed and the first and second electrodes 42 and 44 are formed, the protective layer 40a is formed at portions exposed through the first and second openings 402 and 404, and the conductive type regions 32 and 34 are not exposed to the outside. Therefore, the damage of the conductive type regions 32 and 34 can be prevented when the first and second electrodes 42 and 44 are formed. Accordingly, the solar cell 150 having enhanced properties and efficiency can be manufactured.

In the embodiment of the invention, it is exemplified that the tunneling layer 20, the conductive type regions 32 and 34, and the barrier region 35 are formed, then the front surface field layer 130 is formed, and then, the passivation layer 24, the anti-reflective layer 26, the protective layer 40a, and the insulating layer 40b are formed, and finally, the first and second electrodes 42 and 44 are formed. However, the embodiment of the invention is not limited thereto. Thus, a formation order of the tunneling layer 20, the second conductive type regions 32 and 34, the barrier region 36, the passivation layer 24, the anti-reflective layer 26, the protective layer 40a, and the insulating layer 40b may be varied. In addition, some of layers may be not included, and various modifications are possible.

Hereinafter, solar cells according to other embodiments of the invention and methods for manufacturing the solar cells will be described in detail. A detailed description of the same or similar elements as those in the foregoing description will be omitted herein and a detailed description of only different elements will be provided herein. The first electrode 42 will be described below with reference to the following drawings by way of example, but the following description may also be applied to the second electrode 44.

Figure 6:
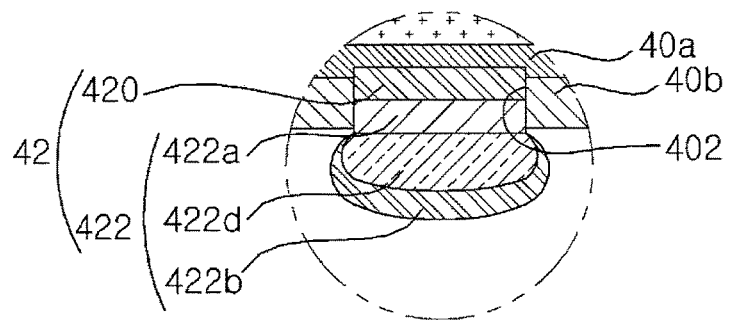
FIG. 6 is a sectional view of an electrode of a solar cell according to another embodiment of the invention.

FIG. 6 is a sectional view of an electrode that may be used in a solar cell according to another embodiment of the invention. FIG. 6 illustrates a portion corresponding to the enlarged circle of FIG. 1.

Referring to FIG. 6, the first electrode 42 of the solar cell according to the embodiment of the invention does not include the seed electrode layer 422c (see FIG. 2), and the third electrode layer 422d is formed on the first electrode layer 422a in contact therewith. In the embodiment of the invention, the seed electrode layer 422c is not formed and thus manufacturing processes may be simplified and manufacturing costs may be reduced.

Figure 7:
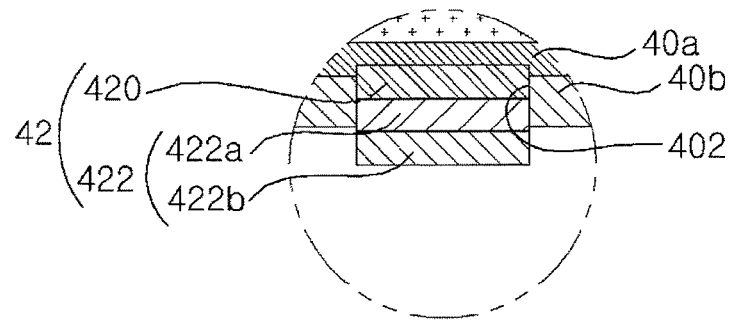
FIG. 7 is a sectional view of an electrode of a solar cell according to yet another embodiment of the invention.

FIG. 7 is a sectional view of an electrode of a solar cell according to yet another embodiment of the invention. FIG. 7 illustrates a portion corresponding to the enlarged circle of FIG. 2.

Referring to FIG. 7, the first electrode 42 of the solar cell according to the embodiment of the invention does not include the seed electrode layer 422c (see FIG. 2) and the third electrode layer 422d (see FIG. 2), and the second electrode layer 422b is formed on the first electrode layer 422a in contact therewith. That is, the first electrode 42 may include the adhesive layer 420, the first electrode layer 422a, and the second electrode layer 422b that contact each other. In this regard, the second electrode layer 422b is a sputter layer formed by sputtering and may include Sn or a Ni—V alloy.

As such, the first electrode 42 including the adhesive layer 420, the first electrode layer 422a, and the second electrode layer 422b may be formed by sputtering or the like. That is, the adhesive layer 420, the first electrode layer 422a, and the seed electrode layer 422c of the first electrode 42 (and/or the second electrode 44) may be formed by entirely forming metal layers respectively constituting the adhesive layer 420, the first electrode layer 422a, and the second electrode layer 422b so as to fill the first openings 402 (the second openings 404 in the instance of the second electrode 44) of the insulating layer 40b formed on the back surface of the semiconductor substrate 10 and patterning the metal layers. The patterning process may be performed using various methods, e.g., a method using a resist and an etchant.

The adhesive layer 420, the first electrode layer 422a, and the second electrode layer 422b, formed by sputtering, are mostly stacked in a thickness direction and thus have a uniform thickness. In addition, the metal layers respectively corresponding to the adhesive layer 420, the first electrode layer 422a, and the second electrode layer 422b are sequentially and entirely formed and then patterned together using the same resist (or mask). Accordingly, side surfaces of at least parts of at least two of the adhesive layer 420, the first electrode layer 422a, and the second electrode layer 422b may have a continuous shape. In addition, the at least parts of the at least two of the adhesive layer 420, the first electrode layer 422a, and the second electrode layer 422b may have area error (or margin of error) within 10% (e.g., within 5%). It can be confirmed that the adhesive layer 420, the first electrode layer 422a, and the second electrode layer 422b are formed by sputtering and patterned together according to thicknesses, shapes, area difference, and the like. However, the embodiments of the invention are not limited to the above examples, and the adhesive layer 420, the first electrode layer 422a, and the second electrode layer 422b may be formed using various methods.

The second electrode layer 422b may have a nano-scale thickness, for example, 50 nm to 300 nm. When the thickness of the second electrode layer 422b is less than 50 nm, adhesion to the ribbon 144 may be reduced. On the other hand, when the thickness of the second electrode layer 422b exceeds 300 nm, manufacturing costs may be increased. The embodiments of the invention are not limited to the above examples and the thickness and the like of the second electrode layer 422b may be variously changed.

As such, in the embodiment of the invention, the first electrode 42 may be formed without performing plating. In an instance in which a portion of the first electrode 42 is formed by plating, when defects such as pin holes, scratch, or the like are present in the insulating layer 40b, plating may be implemented even thereon and thus undesired portions may be plated. In addition, a plating solution used in a plating process is acidic or basic and thus may damage the insulating layer 40b or deteriorate characteristics of the insulating layer 40b. In the embodiment of the invention, by not using a plating process, the characteristics of the insulating layer 40b may be enhanced and the first electrode 42 may be formed using simplified manufacturing processes.

Figure 8:
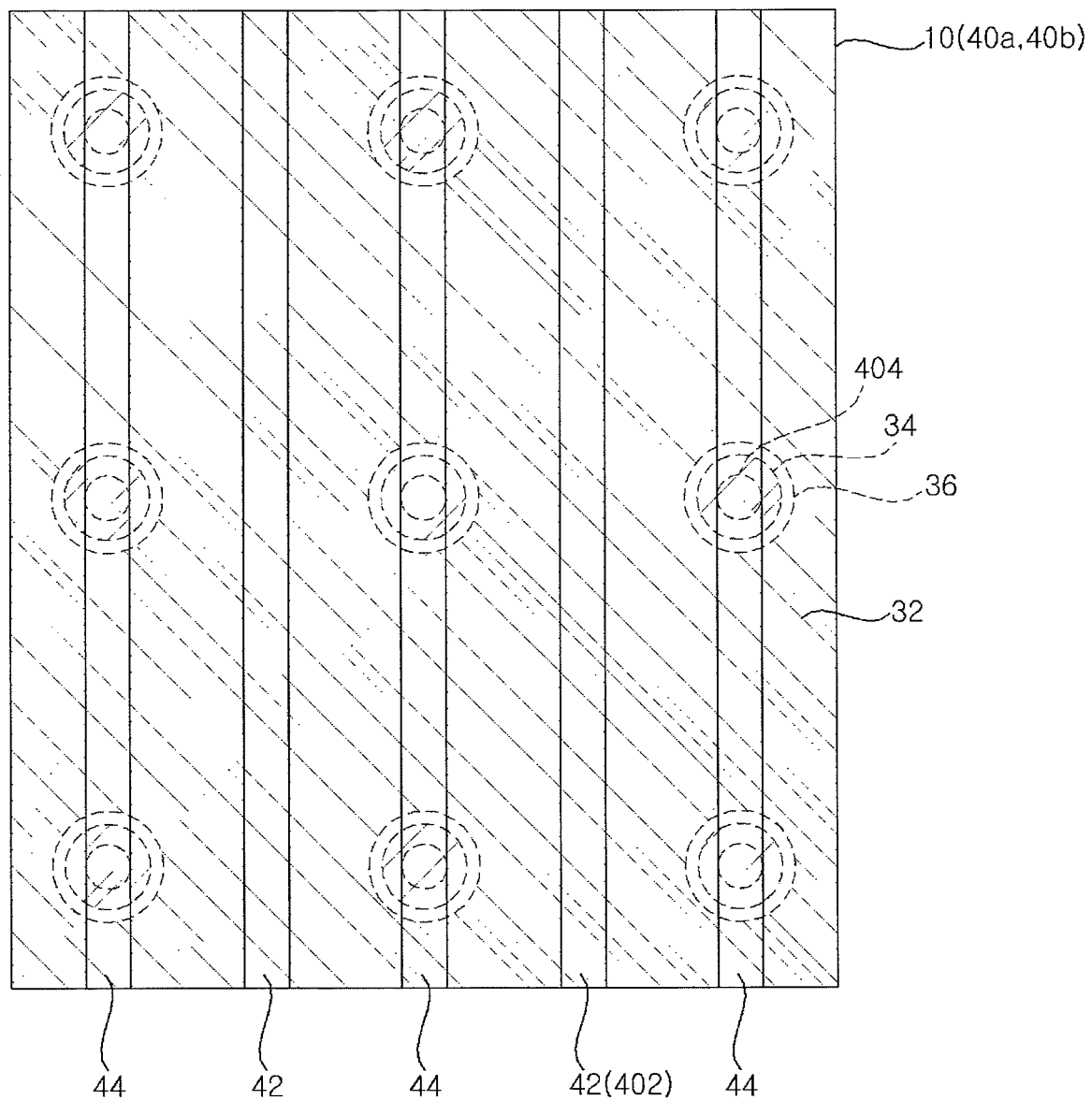
FIG. 8 is a partial rear plan view of the solar cell according to still another embodiment of the invention.

FIG. 8 is a partial rear plan view of the solar cell according to still another embodiment of the invention.

Referring to FIG. 8, in the solar cell 150 according to the embodiment of the invention, plural second conductive type regions 34 may have an island shape and be spaced apart from each other, and the first conductive type region 32 may be entirely formed in a portion excluding the second conductive type regions 34 and the barrier region 36 surrounding each second conductive type region 34.

Due to such a configuration, the first conductive type region 32 has an area as wide as possible and thus photoelectric conversion efficiency may be enhanced. In addition, the second conductive type regions 34 may be disposed on the semiconductor substrate 10 with a large area while the first conductive type region 32 has a minimized area. Accordingly, surface recombination may be effectively prevented or reduced by the second conductive type regions 34 and the area of the second conductive type regions 34 may be maximized. However, the embodiment of the invention is not limited to the above examples, and the second conductive type regions 34 may have various shapes that enable the second conductive type regions 34 to have a minimized area.

Although FIG. 8 illustrates the second conductive type regions 34 as having a circular shape, the embodiment of the invention is not limited thereto. That is, the second conductive type regions 34 may also have a planar shape, for example, an oval shape or a polygonal shape such as a triangle, a tetragon, a hexagon, or the like.

The first and second openings 402 and 404 formed in the insulating layer 40b may have different shapes in consideration of shapes of the respective first and second conductive type regions 32 and 34. That is, the first opening 402 may extend long on the first conductive type region 32, and plural second openings 404 may be spaced apart from each other to correspond to the respective second conductive type regions 34. This is considering that the first electrode 42 is disposed only on the first conductive type region 32, and the second electrode 44 is disposed on the first and second conductive type regions 32 and 34. That is, the second openings 404 of the insulating layer 40b are formed to correspond to portions in which the second conductive type regions 34 are disposed, and the second electrode 44 and the second conductive type region 34 are connected by the second opening 404. In addition, the second openings 404 are not formed in portions of the insulating layer corresponding to the first conductive type regions 32 and thus the second electrodes 44 may insulate from the first conductive type regions 32. The first electrode 42 is formed only on each first conductive type region 32 and thus the first opening 402 may have the same or similar to that of the first electrode 42 and, accordingly, the first electrodes 42 may entirely contact the first conductive type regions 32 thereon. However, the embodiment of the invention is not limited to the above examples and various modifications are possible. For example, the first openings 402 may be formed as a plurality of contact holes having a similar shape to that of the second openings 404.

One or more embodiments of the invention will now be described more fully with reference to the following examples. However, these examples are provided for illustrative purposes only and are not intended to limit the scope of the invention.

Example 1

A semiconductor substrate including a base region of an n-type was prepared. A first region of a back surface of the semiconductor substrate was doped with boron (B) by ion implantation to form an emitter region, and a second region of the back surface of the semiconductor substrate was doped with phosphorus (P) by ion implantation to form a back surface field region.

A passivation layer and an anti-reflective layer were formed on a front surface of the semiconductor substrate, and a protective layer including a silicon oxide and an insulating layer including a silicon carbide were formed on the back surface of the semiconductor substrate. A thickness of the protective layer was about 2 mm. And then, by using a laser, the insulating layer is selectively etched while the protective layer is maintained. Subsequently, a titanium (Ti) layer (an adhesive layer) having a thickness of 5 nm and a copper (Cu) layer (a first electrode layer) having a thickness of 200 nm were sequentially formed in or at the first and second openings by sputtering and then patterned, thereby forming a first electrode electrically connected to the emitter region and a second electrode electrically connected to the back surface field region. Thereby, the first electrode was connected to the emitter region while interposing the protective layer and the second electrode was connected to the back surface field region while interposing the protective layer. In addition, a process of reducing occurrence of cracks in the insulating layer (namely, a curing process) was performed by heat treatment at a temperature of 250° C., thereby completing manufacture of a solar cell.

For reference, in the embodiment of the invention, to measure only characteristics by the adhesive layer and the first electrode layer, a second electrode layer and the like were not formed and only the adhesive layer and the first electrode layer were formed.

Comparative Example 1

A solar cell was manufactured in the same manner as in Example 1, except that the protective layer was not formed. Thus, in Comparative Example, the first and second electrodes are in contact with the conductive type regions.

Saturation currents according to the solar cells manufactured according to Example 1 and Comparative Example 1 were measured, and measurement results are illustrated in Table 1.

TABLE 1

|  | Saturation current [A] |
|---|---|
| Example 1 | $1 \times 10^{-14}$ |
| Comparative Example 1 | $20 \times 10^{-14}$ |

Referring to Table 1, it can be confirmed that the saturation current of the solar cell according to Example 1 is greatly smaller than the saturation current of the solar cell according to Comparative Example 1. Thus, the property of the saturation current can be enhanced in Example 1. This is expected because the surface recombination between the emitter region and the first electrode and/or the back surface field region and the second electrode are reduced in the solar cell according to Example 1. Accordingly, it can be seen that open circuit voltage (Voc) can be enhanced and thus efficiency can increase in the solar cell according to Example 1.

Figure 9:
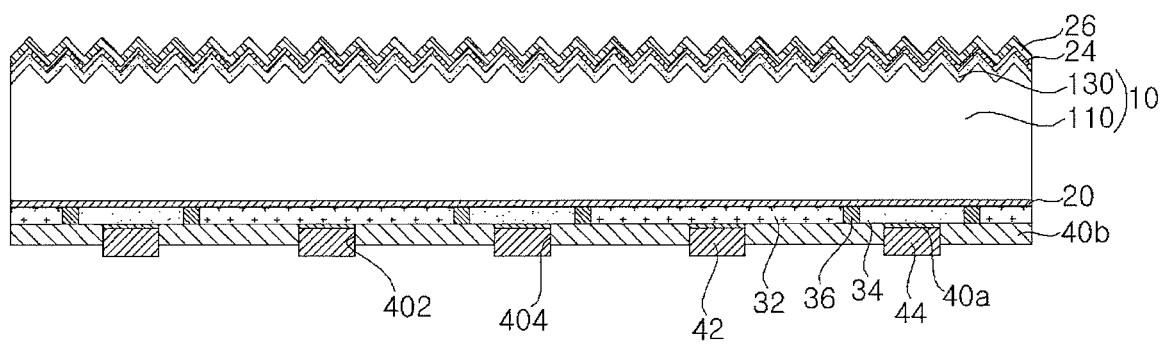
FIG. 9 is a cross-sectional view of a solar cell according to a modified embodiment of the invention.
Figure 10:
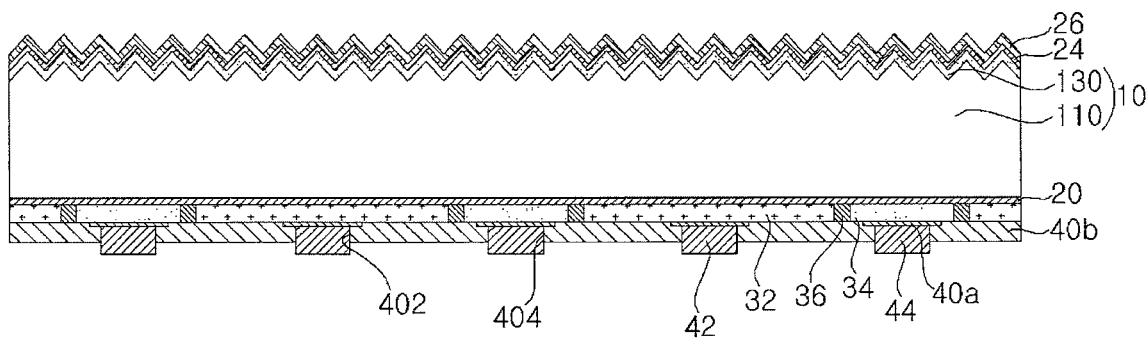
FIG. 10 is a cross-sectional view of a solar cell according to another modified embodiment of the invention.
Figure 11:
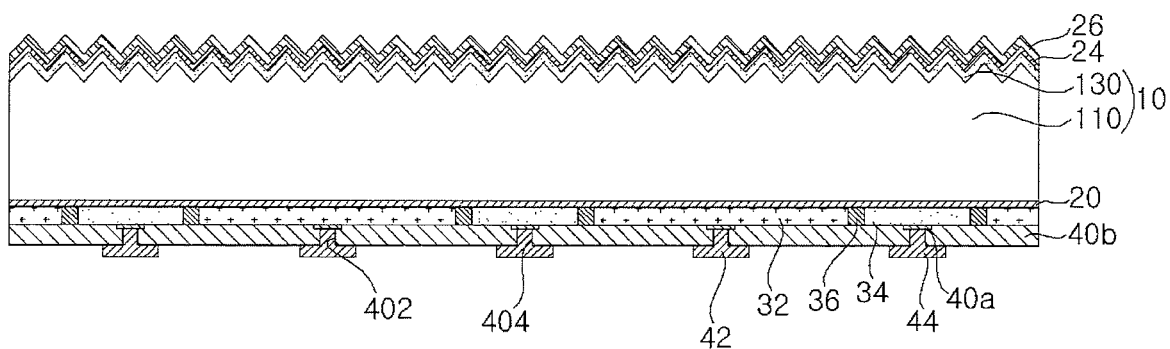
FIG. 11 is a cross-sectional view of a solar cell according to yet another modified embodiment of the invention.

In the above embodiments of the invention, it is exemplified that the protective layer 40a extends over the entire area of the conductive regions 32 and 34 and the barrier region 36. However, the embodiments of the invention are not limited thereto. Thus, as a modified embodiment of the invention, the protective layer 40a extends over only a portion of the conductive regions 32 and 34 where the electrodes 42 and 44 are positioned, as shown in FIG. 9. In the modified embodiment of the invention, the protective layer 40a has the same width as the corresponding one of the electrodes 42 and 44. Also, as another modified embodiment of the invention, the protective layer 40a extends over only a portion of the conductive regions 32 and 34 and the barrier region 36 and is wider than the corresponding one of the electrodes 42 and 44, as shown in FIG. 10. Then, the protective layer 40a can extend over the entire area of a portion of the conductive regions 32 and 34 where the electrodes are positioned even though there is a process error. Further, as yet another modified embodiment of the invention, the protective layer 40a extends over only a portion of the conductive regions 32 and 34 and the barrier region 36 and corresponds to a part of the electrode 42 or 44, as shown in FIG. 11. The protective layer 40a may be shorter than, be wider than, or have the same width as the corresponding one of the electrodes 42 and 44. In the modified embodiment of the invention, the protective layer 40a is positioned between the conductive region 32 or 34 and a part of the electrode 42 or 44, and the insulating layer 40b is positioned between the conductive region 32 or 34 and the other part of the electrode 42 or 44. Then, the width or the area of the electrode 42 and 44 can be increased even though the area of the opening 402 or 404 or the protective layer 40a is relatively small. Accordingly, the electrical resistance of the electrode 42 and 44 can be reduced. Other modifications are possible.

Particular characteristics, structures, or effects described in connection with the embodiment of the invention are included in at least one embodiment of the embodiments of the invention and not necessarily in all embodiments of the invention. Furthermore, the particular characteristics, structures, or effects of any specific embodiment of the embodiments of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiments of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments of the invention. In addition, it is to be understood that differences relevant to the variations and modifications fall within the spirit and scope of the embodiments of the invention defined in the appended claims.

What is claimed is:

1. A method for manufacturing a solar cell, the method comprising:
    forming a tunnel oxide layer on a first surface of a silicon substrate;
    forming a polysilicon layer comprising a first conductive type region and a second conductive type region, and a barrier region between the first and second conductive type regions on the tunnel oxide layer;
    forming a protective layer on the polysilicon layer;
    forming an insulating layer on the protective layer;
    forming an opening penetrating the insulating layer and a portion of the protective layer by eliminating the insulating layer and an upper surface of the protective layer by laser ablation, thereby forming a depressed portion in the protective layer as a laser-etched trace; and
    forming an electrode in the opening of the insulating layer, the electrode being spatially separated from the first conductivity type region and the second conductive type region by the protective layer where the depressed portion is formed and the electrode being directly formed on the laser-etched trace,
    wherein the protective layer has a band gap larger than a band gap of the insulating layer.

2. The method according to claim 1, wherein the protective layer is maintained during the laser ablation for forming the opening, and
    wherein the laser ablation melts the insulating layer and without melting through the protective layer.

3. The method according to claim 1, wherein the electrode comprises an adhesive layer in contact with the protective layer and an electrode layer formed on the adhesive layer.

4. The method according to claim 1, wherein the protective layer comprises an oxide or an amorphous semiconductor, and
    the insulating layer comprises a nitride or a carbide.

5. The method according to claim 1, wherein the protective layer is thinner than the insulating layer.

6. The method according to claim 1, wherein the protective layer has a thickness of about 1 nm to about 3 nm.

7. The method according to claim 3, wherein the adhesive layer has a transparency and an electrical conductivity, and
    wherein the adhesive layer comprises titanium (Ti) or tungsten (W).

8. The method according to claim 1, wherein the protective layer performs a tunneling function where the depressed portion is formed.

9. The method according to claim 1, wherein the forming the first conductive type region and the second conductive type region includes forming the first conductive type region at least twice as wide as the second conductive type region.

10. The method according to claim 1, wherein the forming the electrode includes forming a first electrode layer and a second electrode layer on the first electrode layer, and
    wherein the second electrode layer has a thickness of 5 μm to 10 μm and has a convexly rounded shape.

11. The method according to claim 3, wherein the laser used for the laser ablation has a wavelength of light that is smaller than the band gap of the protective layer and larger than the band gap of the insulating layer.

12. The method according to claim 3, wherein the adhesive layer has a coefficient of thermal expansion between a coefficient of thermal expansion of the first and second conductive type regions and a coefficient of thermal expansion of a portion of the electrode layer adjacent to the adhesive layer.

* * * * *